US012622080B1

(12) United States Patent
Klamkin et al.

(10) Patent No.: US 12,622,080 B1
(45) Date of Patent: May 5, 2026

(54) FRONT-END AND BACK-END PROCESSING METHOD AND DEVICE FOR INTEGRATED SENSOR ARRAY USING ISOLATION STRUCTURES

(71) Applicant: Aeluma, Inc., Goleta, CA (US)

(72) Inventors: Jonathan Klamkin, Goleta, CA (US); Bowen Song, Goleta, CA (US); Bei Shi, Goleta, CA (US)

(73) Assignee: Aeluma, Inc., Goleta, CA (US)

( * ) Notice: Subject to any disclaimer, the term of this patent is extended or adjusted under 35 U.S.C. 154(b) by 448 days.

(21) Appl. No.: 18/353,785

(22) Filed: Jul. 17, 2023

(51) Int. Cl.
*H10F 39/00* (2025.01)
*H10F 39/12* (2025.01)

(52) U.S. Cl.
CPC ......... *H10F 39/807* (2025.01); *H10F 39/011* (2025.01); *H10F 39/199* (2025.01); *H10F 39/811* (2025.01)

(58) Field of Classification Search
CPC .... H10F 39/807; H10F 39/011; H10F 39/199; H10F 39/811
See application file for complete search history.

(56) References Cited

U.S. PATENT DOCUMENTS

2022/0413156 A1* 12/2022 Klamkin ............ H10F 39/8033

* cited by examiner

*Primary Examiner* — Tucker J Wright
(74) *Attorney, Agent, or Firm* — Richard T. Ogawa; Ogawa P.C.

(57) ABSTRACT

An integrated sensor array device and method. The method includes providing a partially completed semiconductor substrate having a material stack used to form a sensor array device with a plurality of device regions. One or more isolation trench regions separating the device regions can be formed in a front-end isolation process during the formation of the device regions or in a back-end isolation process following a bonding process to integrate the sensor array device to an integrated circuit (IC) device. Prior to the front-end or back-end processing, metal interconnect materials within a passivation material can be formed via a planarization process to provide connection to n-type and p-type contact regions of the sensor array device. The resulting planarized sensor array device can then be bonded to the IC device, and a plurality of surface relief structures can be formed overlying a backside surface region of the planarized sensor array device.

24 Claims, 43 Drawing Sheets

1100

1150

1142

1150

1150

1140

1130

1120

1110

FRONT-END AND BACK-END PROCESSING METHOD AND DEVICE FOR INTEGRATED SENSOR ARRAY USING ISOLATION STRUCTURES

CROSS-REFERENCES TO RELATED APPLICATIONS

N/A

BACKGROUND OF THE INVENTION

Electronics have proliferated over the years. These devices rely on miniature chips made from semiconductor materials such as Silicon (Si). These materials are also used to make sensing devices that can capture images of scenes. Si is widely used because it is an abundant material and Si semiconductor manufacturing is extremely mature due to the investments made in the electronics industry. A common technology process is called complementary metal oxide semiconductor, or "CMOS." The CMOS technology was developed for manufacturing integrated circuits but is now used for image sensors. Such image sensors are called CMOS image sensors. Often times, such CMOS image sensors are manufactured using high-volume manufacturing with 12-inch Si wafers.

Despite the advances with CMOS image sensors, limitations or drawbacks exist. For example, CMOS image sensors have limitations in the detectable wavelength range. Additionally, such CMOS image sensors suffer from poor sensitivity at longer wavelengths within the detectable wavelength range. These and other limitations may also exist.

From the above, it is desired that industry develop improved sensing devices.

BRIEF SUMMARY OF THE INVENTION

The present invention is generally related to electronic devices. More specifically, the present invention provides techniques related to sensor devices and sensor arrays using semiconductor materials on Si, along with subsequent circuit fabrication and integration methods. Merely by way of example, the present invention can be applied to various applications including image sensing, range finding, including LIDAR, among others, but it will be recognized that there are many other applications.

According to various examples, the present invention provides for methods of fabricating an integrated sensor array device, as well as the resulting devices. The methods include providing a partially completed semiconductor substrate and forming an overlying first dielectric material. This partially completed substrate includes at least a silicon substrate, a buffer material overlying the silicon substrate, an n-type semiconductor material overlying the silicon substrate, a transition material overlying the n-type semiconductor material, and an unintentionally doped (UID) optically transparent semiconductor material overlying the transition material. A portion of the first and second dielectric materials overlying the UID optically transparent semiconductor within each device can be removed to form a first contact trench region exposing a portion of the UID optically transparent semiconductor material of each device region, and then a p-type contact region is formed within a portion of the UID optically transparent semiconductor material. Depending on the application, a plurality of device regions can be separated using front-end trench isolation, back-end trench isolation, or a combination thereof.

In the case of front-end trench isolation, at least one or more portions of the UID optically transparent material and the transition material are removed to form one or more isolation trench regions separating a plurality of device regions. Also, a recessed region is formed along with the isolation trench regions, and a portion of the first dielectric material within the recessed region can be removed to form an n-type contact region. Then, a second dielectric material is formed overlying the first dielectric material, the one or more isolation trench regions, the recessed region, and the n-type contact region. Further, metal isolation trench regions with metal fill materials can be formed within the trench isolation regions and the second dielectric material.

The method also includes forming a first metal contact material within the first contact trench region overlying the p-type contact region of each device region. Similarly, a portion of these dielectric materials can be removed overlying the n-type contact region to form a second contact trench region. A second metal contact material can be formed overlying the n-type contact region within the second contact trench region, and a third dielectric material can be formed overlying the second dielectric material, the first metal contact materials, and the second metal contact materials.

The method can also include various planarization steps to prepare the sensor array device for integration with another integrated circuit (IC) device, such as a read-out integrated circuit (ROIC) device. In an example, a plurality of first portions of the third dielectric material can be removed to define a first bond pad region overlying the first metal contact material of each device region, and a second portion of the third dielectric material can be removed to define a second bond pad region overlying the second metal contact material. A first bond pad is formed within the first bond pad region of each device region, and a second bond pad is formed within the second bond pad region. A first metal interconnect material can be formed overlying each first bond pad, and a passivation material is formed overlying the first metal interconnect materials, the first bond pads, and the third dielectric material. Then, one or more portions of the passivation material can be removed using a planarization process to smooth the passivation material and expose the first metal interconnect materials, resulting in a planarized sensor array device, which can be subsequently bonded overlying an IC device such that the first metal interconnect materials are coupled to a first plurality of first IC bond pads of the IC device and the second metal interconnect material is coupled to a second IC bond pad of the IC device.

Alternatively, instead of forming the first and second bond pads, the method can form the passivation layer overlying the second dielectric material and the first metal contact material of each device region. Then, a portion of the passivation layer overlying the first metal contact material of each device region can be removed to form an interconnect footprint cavity overlying the first metal contact material of each device region. A metal interconnect layer can be formed overlying the passivation layer and within the interconnect footprint cavity of each device region. Then, one or more portions of the metal interconnect layer can be removed using a planarization process to form a metal interconnect material within the interconnect footprint cavity of each device region, resulting in a planarized device, which can be subsequently bonded overlying the IC device, as described previously.

In the case of back-end trench isolation, the isolation trench regions are not formed Instead, backside isolation trench regions are formed within the planarized sensor array device after the bonding process to the IC device to separate the device regions. Similarly, a backside metal fill material can be formed within each backside isolation trench region. Also, a plurality of surface relief structures can be formed overlying a backside surface region of the silicon substrate, or the silicon substrate may be removed by a grinding or etching process and the plurality of surface relief structures can be formed overlying an optics silicon substrate that is subsequently bonded to the backside of the planarized sensor array device. Further, a backside contact structure can be formed with a backside metal fill material within a backside contact trench region to provide connectivity to the backside surface region of the sensor array device.

Benefits or advantages are achieved over conventional techniques. The integration platform based on semiconductor materials and device structures on Si can enable large-volume manufacturing of sensor and sensor array devices. These devices fabricated using the present techniques can exhibit improved detectable wavelength range, higher sensitivity, or other related performance metrics. These and other benefits or advantages are described throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1:
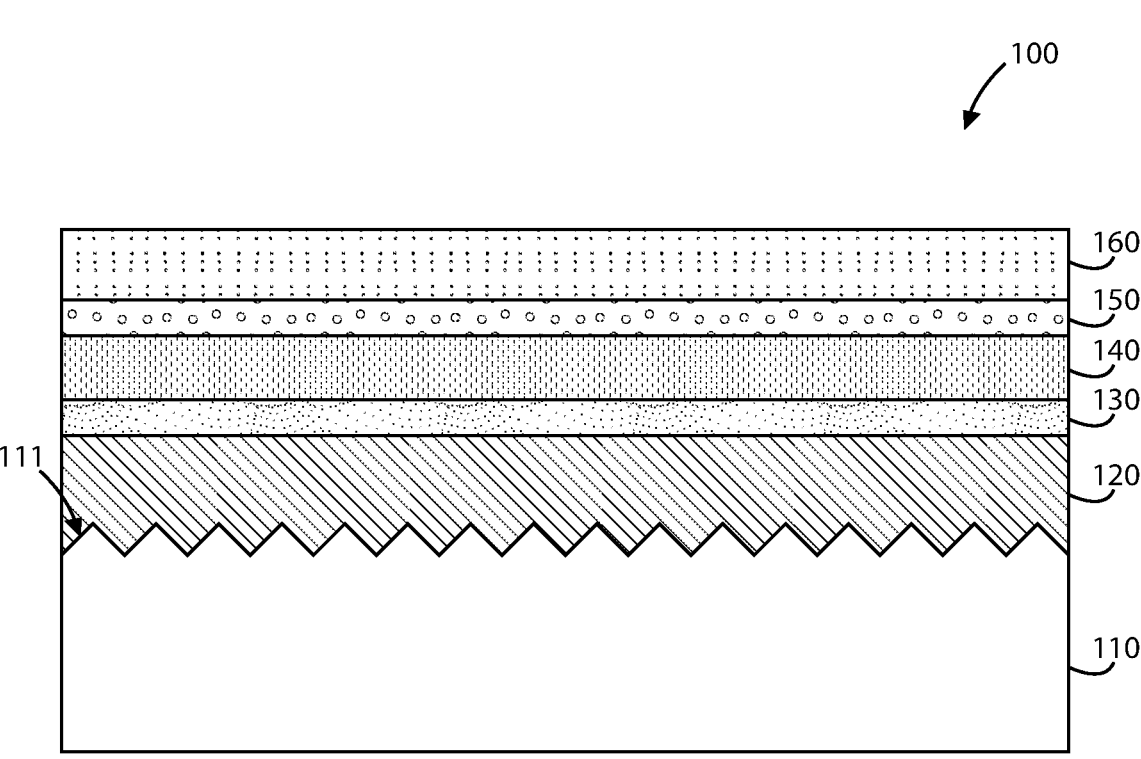
FIGS. 1 to 8 are simplified diagrams illustrating a method of fabricating a sensor device according to an example of the present invention.

The present invention is generally related to electronic devices. More specifically, the present invention provides techniques related to sensor devices and sensor arrays using semiconductor materials on Si, along with subsequent circuit fabrication and integration methods. Merely by way of example, the present invention can be applied to various applications including image sensing, range finding, including LIDAR, among others, but it will be recognized that there are many other applications.

In an example, the present invention provides method and device for realizing highly manufacturable and scalable semiconductor devices, including sensor devices and sensor arrays, on Si substrates. By directly depositing semiconductor materials on Si substrates, mature Si microelectronics manufacturing processes can be leveraged to fabricate high performance sensor devices and sensor arrays. Deposition on 12-inch Si substrates, which are common for CMOS technologies, enables the subsequent fabrication in CMOS manufacturing lines; however, the technology is not limited to 12-inch Si substrates only. Semiconductor materials can be deposited directly onto Si substrates with the techniques described in the present invention.

The deposition of semiconductor materials can include heteroepitaxy and related techniques. The heteroepitaxy step or steps may be carried out with techniques including, but not limited to, metalorganic chemical vapor deposition (MOCVD), molecular beam epitaxy (MBE), metalorganic MBE (MOMBE), chemical beam epitaxy (CBE), hydride vapor phase epitaxy (HVPE), liquid phase epitaxy (LPE), or any combination thereof.

In addition to Si substrates, alternative substrates may be used including, but not limited to, silicon on insulator (SOI), miscut Si, SOI on miscut Si, or germanium (Ge) on Si, without departing from the scope of the invention.

In another embodiment, the semiconductor nucleation, buffer materials and subsequent photodetector materials may be deposited and formed by selective area heteroepitaxy, whereby the Si or similar substrate could be first patterned with a dielectric to form recesses, within which the semiconductor nucleation, the buffer materials and the photodetector materials could be selectively deposited. Selective area heteroepitaxy is the process by which the Si substrate would be patterned with a dielectric, and the subsequent deposition of semiconductor materials would deposit selectively on the exposed Si surfaces but not on the dielectric surfaces. Selective area heteroepitaxy is beneficial for improving the quality of the semiconductor material on Si, for facilitating photodetector fabrication, and also for realization of novel device structures. Selective area heteroepitaxy can improve material quality by releasing thermal strain caused by the mismatch in thermal expansion coefficient between the semiconductor materials and the Si, and by providing aspect ratio trapping of defects and dislocations.

FIGS. 1 to 8 are simplified diagrams illustrating a method of fabricating a sensor device according to an example of the present invention. In these figures, shared reference numerals in subsequent figures refer to the same elements as described in previous figures. Further, with regard to the method discussed below, steps may be added, removed, rearranged, or combined depending upon the application.

FIG. 1 is a simplified diagram of a sensor device 100 according to an example of the present invention. As shown, device 100 is a partially completed semiconductor substrate in an intermediate stage of fabrication for a sensor or sensor array device. Here, device 100 can include a Si substrate 110 with an overlying buffer material 120. In this case, the surface region 111 of the Si substrate 110 underlying the buffer material 120 is patterned with recesses. Photodetector device materials, including an n-type semiconductor material 140, an unintentionally doped (UID) optically absorptive semiconductor material 150, and a UID optically transparent semiconductor material 160 (or p-type semiconductor material), are spatially configured overlying the buffer material 120. In a specific example, the photodetector device materials can have repeating or alternating layers of the previously mentioned materials.

In a specific example, the device materials can include InP, InGaAs, gallium arsenide (GaAs), gallium phosphide (GaP), indium gallium arsenide phosphide (InGaAsP), indium aluminum gallium arsenide (InAlGaAs), indium arsenide (InAs), indium gallium phosphide (InGaP), or a combination thereof.

Additionally, the photodetector device structure can be configured with a separate absorption material comprising InGaAs or InGaAsP, and a multiplication material comprising InP whereby the multiplication material generates additional charge carriers by avalanche gain.

In a specific example, a transition material 130 is spatially configured between the buffer material 120 and the photodetector device materials (140, 150, 160). The transition material 130 can be configured with a material composition that transitions or partially transitions between an underlying material and an overlying material. As an example, the transition material 130 can have a material composition that partially transitions from the buffer material 120 to the n-type semiconductor material 140.

In an example, the partially completed semiconductor substrate can also include an insulating material (e.g., native insulating material, native oxide, or the like) overlying the semiconductor layers. In a specific example, a transition layer can be formed overlying the buffer material and spatially configured between the buffer material and the plurality of semiconductor layers (e.g., between the buffer material and the n-type semiconductor material).

In cases in which further processing needs to be done at another location, the partially completed semiconductor substrate can be placed into a first carrier device, which can include a wafer boat, a Front Opening Unified Pod (FOUP), a Front Opening Shipping Box (FOSB), or the like. The first carrier device can also be sealed and maintained in a predetermined environment including a nitrogen containing material, inert gas, clean dry air (CDA), or the like. This first carrier device with the partially completed semiconductor substrate can be transferred from a first geographic location to a second geographic location. The partially completed substrate can then be transferred to a second carrier device, which can include wafer fabrication equipment, semiconductor manufacturing equipment, chip foundry equipment, or the like. Further, the partially completed semiconductor can be cleaned using one or more methods, such as a wet chemical treatment, an ultrasonic bath, a solvent, purified water, deionized water, etch dilution, a milling process, a gas blowing process, a spin-drying process, or the like.

Figure 2:
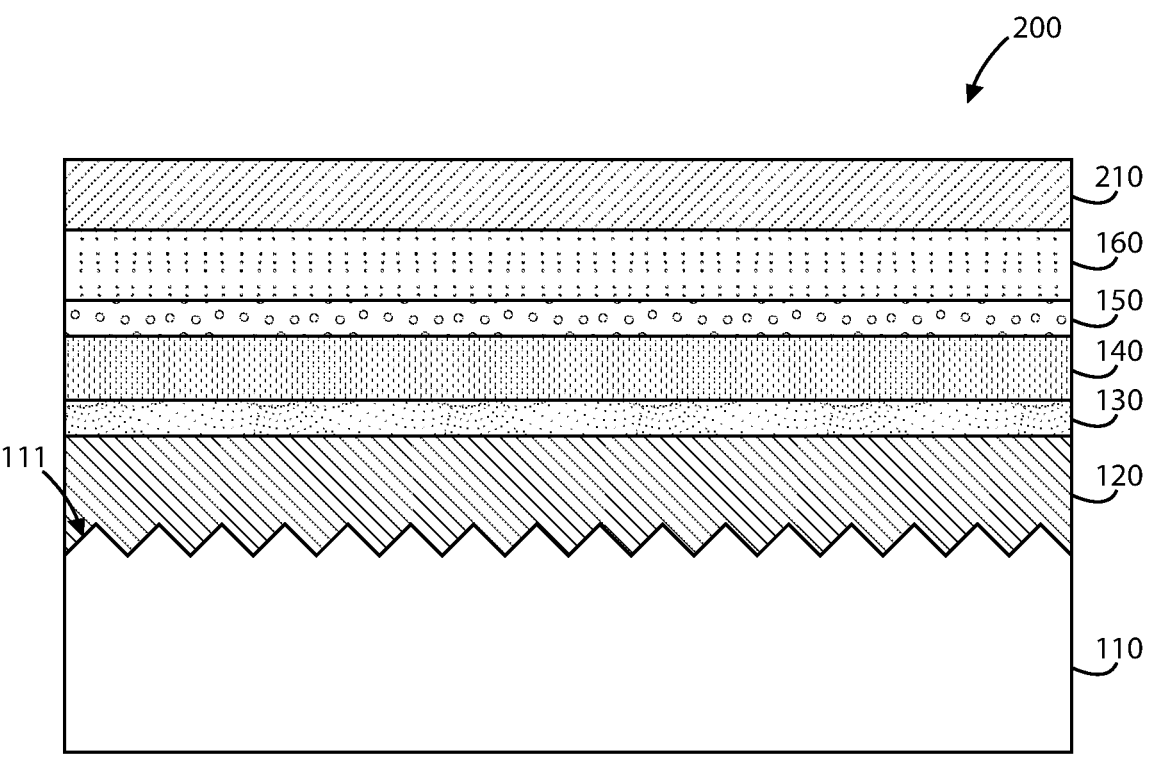

FIG. 2 is a simplified diagram illustrating an example method step of forming a dielectric material 210 overlying a surface region of the partially completed semiconductor substrate 100 of FIG. 1, resulting in device 200. As shown, the dielectric material 210 is formed overlying the UID optically transparent semiconductor material 160. In an example, the dielectric material is selected from silicon nitride, aluminum nitride, an oxide material, a nitride material, silicon dioxide, aluminum dioxide, a silicate material, or the like.

Figure 3:
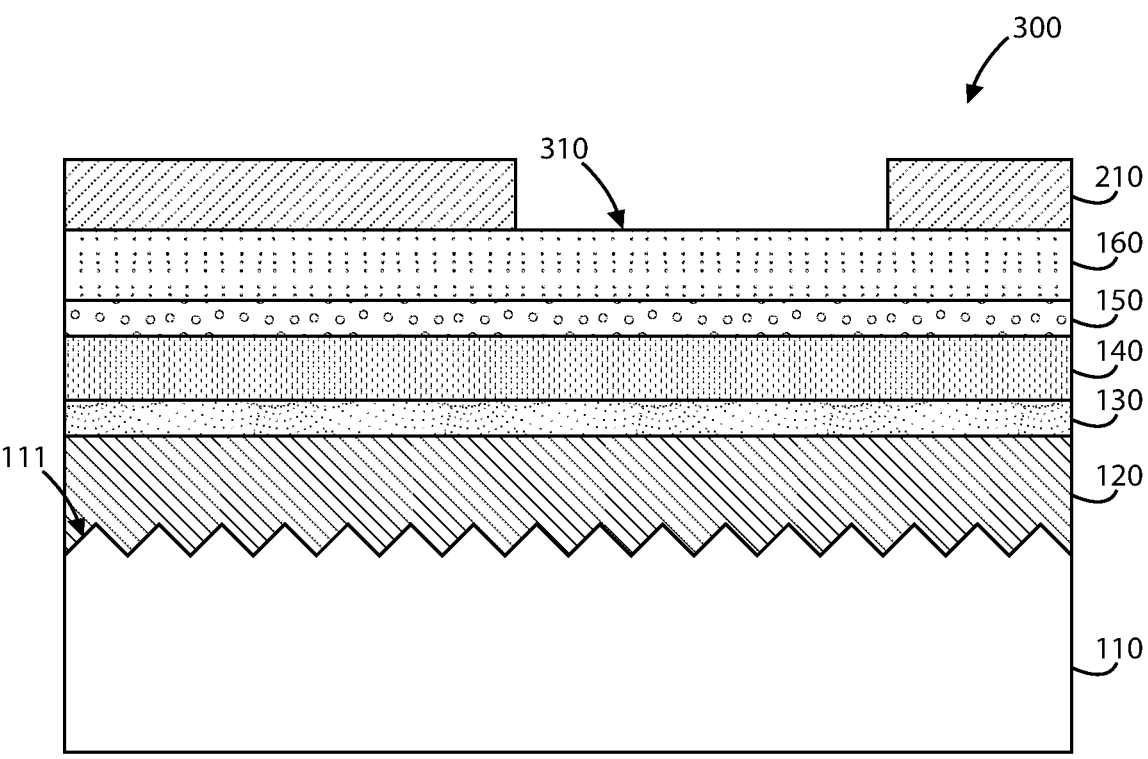

FIG. 3 is a simplified diagram illustrating an example method step of forming a p-type contact region 310 overlying a first portion of the partially completed substrate surface region to define a pattern in the dielectric material, resulting in device 300. As shown, the p-type contact region 310 can include an exposed region of the UID optically transparent semiconductor material 160.

Figure 4:
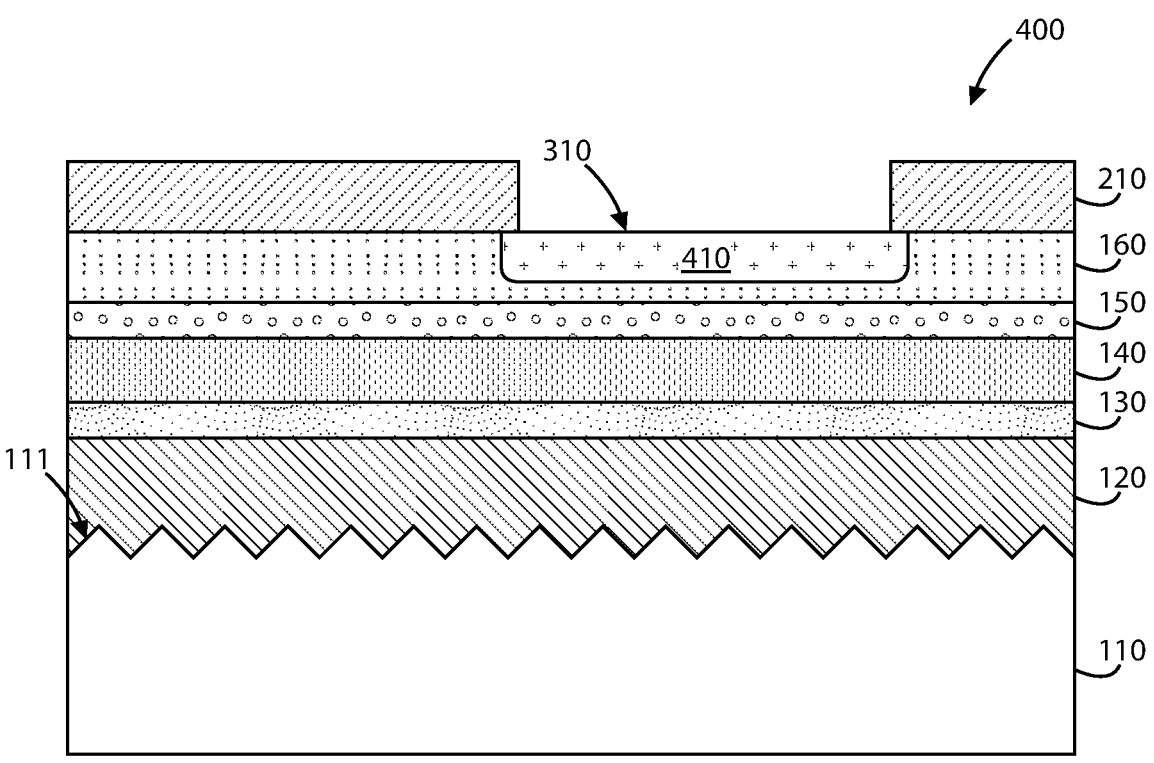

FIG. 4 is a simplified diagram illustrating an example method step of forming a p-type semiconductor region 410 using the pattern in the dielectric material, resulting in device 400. In an example, the p-type semiconductor region 410 can be formed using the dielectric pattern to introduce a p-type impurity into the UID optically transparent semiconductor material 160. This impurity introduction can include an implantation process, a diffusion process, or the like.

Depending on the specific semiconductor material used, the p-type semiconductor region 410 can be formed with diffusion of an impurity material that may be zinc, beryllium, or carbon, or the like. In a specific example, the n-type material can include an InP material with a silicon impurity having a concentration ranging from 5E17 cm$^{-3}$ to 5E18 cm$^{-3}$. The absorption material can include an InGaAs containing material and can be primarily (or substantially) free from any impurity. And, the p-type material can include a zinc impurity or a beryllium impurity having a concentration ranging from 5E17 cm$^{-3}$ to 1E20 cm$^{-3}$.

In an alternative photodetector CS device structure, the n-type material includes a GaAs material comprising an silicon impurity having a concentration ranging from 5E17 cm$^{-3}$ to 5E18 cm$^{-3}$, the absorption material includes an InAs quantum dot material, and the p-type material includes a zinc impurity or a beryllium impurity or a carbon impurity having a concentration ranging from 5E17 cm$^{-3}$ to 1E20 cm$^{-3}$.

Figure 5:
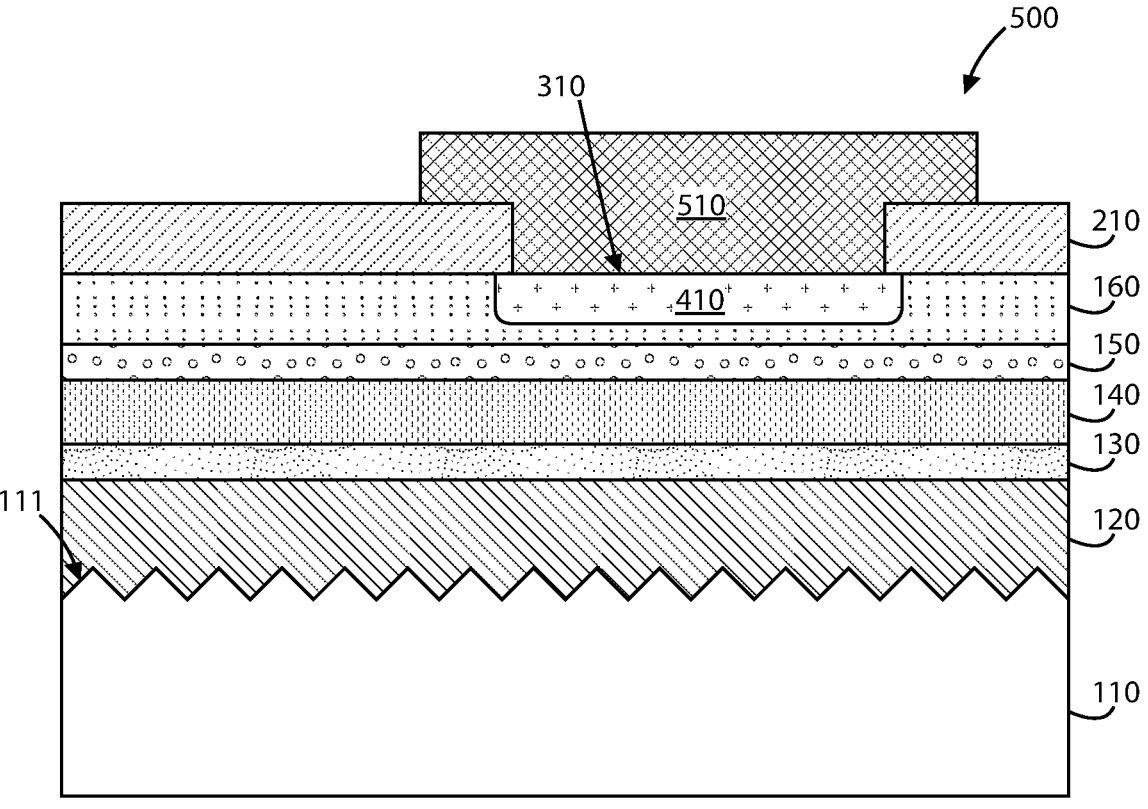

FIG. 5 is a simplified diagram illustrating an example method step of forming a p-type metal contact region 510 overlying the p-type contact region 310, resulting in device 500. In an example, the p-type metal contact region can include titanium, platinum, gold, nickel, palladium, germanium, tungsten, aluminum, zinc, or the like and combinations thereof.

Figure 6:
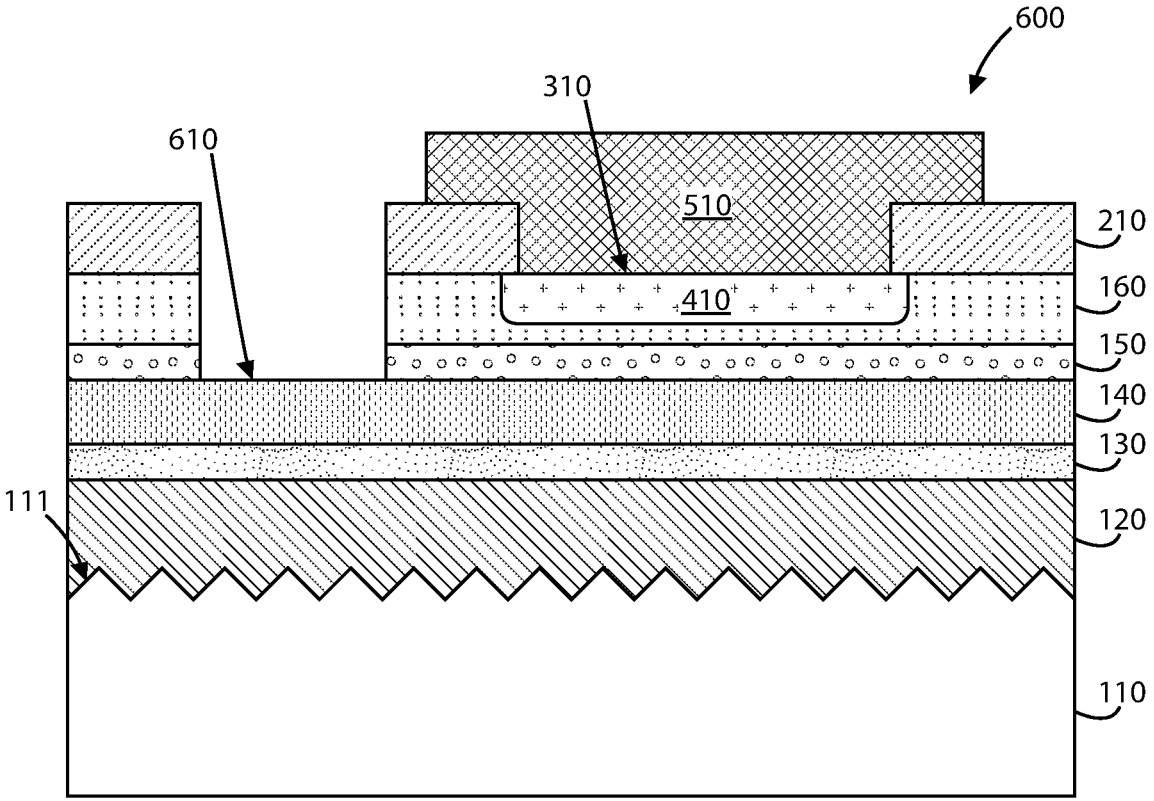

FIG. 6 is a simplified diagram illustrating an example method step of forming an n-type contact region or opening 610, resulting in device 600. This step can include etching one or more portions of the UID optically transparent semiconductor material 160, the UID optically absorptive semiconductor material 150, and the n-type semiconductor material 140 to define the n-type contact opening 610. In an example, the dielectric material can be further patterned for this n-type contact opening 610 or the pattern can already expose the underlying materials with the pattern discussed for FIG. 3. Further, each of the underlying materials (140, 150, 160) may be etched is separate steps.

Figure 7:
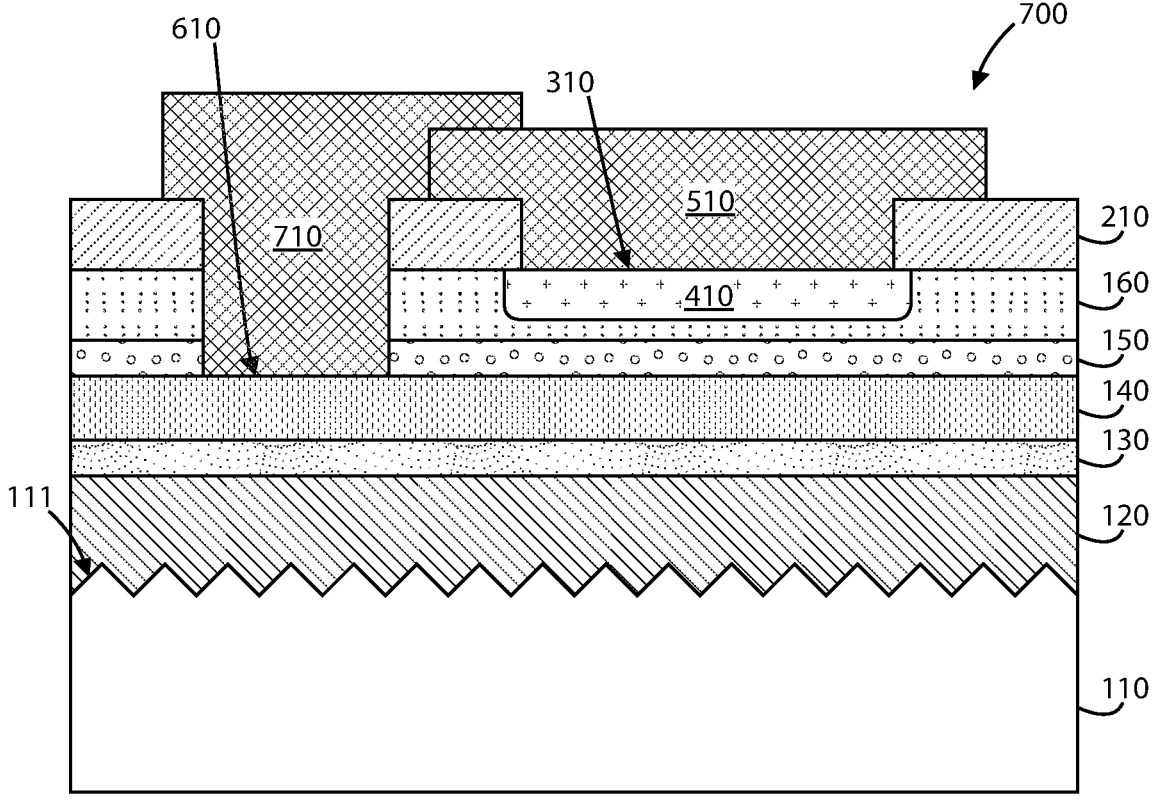

FIG. 7 is a simplified diagram illustrating an example method step of forming an n-type metal contact region 710 within the previously etched portions to form a common n-type electrode, resulting in device 700. As shown, the n-type metal contact region 710 is formed overlying the n-type contact opening 610 and a portion of the p-type metal contact region 510. This connects the p-type metal contact region 510 to the n-type semiconductor material 140, which creates a common n-type electrode with any other sensor element configured within the same device (see FIG. 9).

Figure 8:
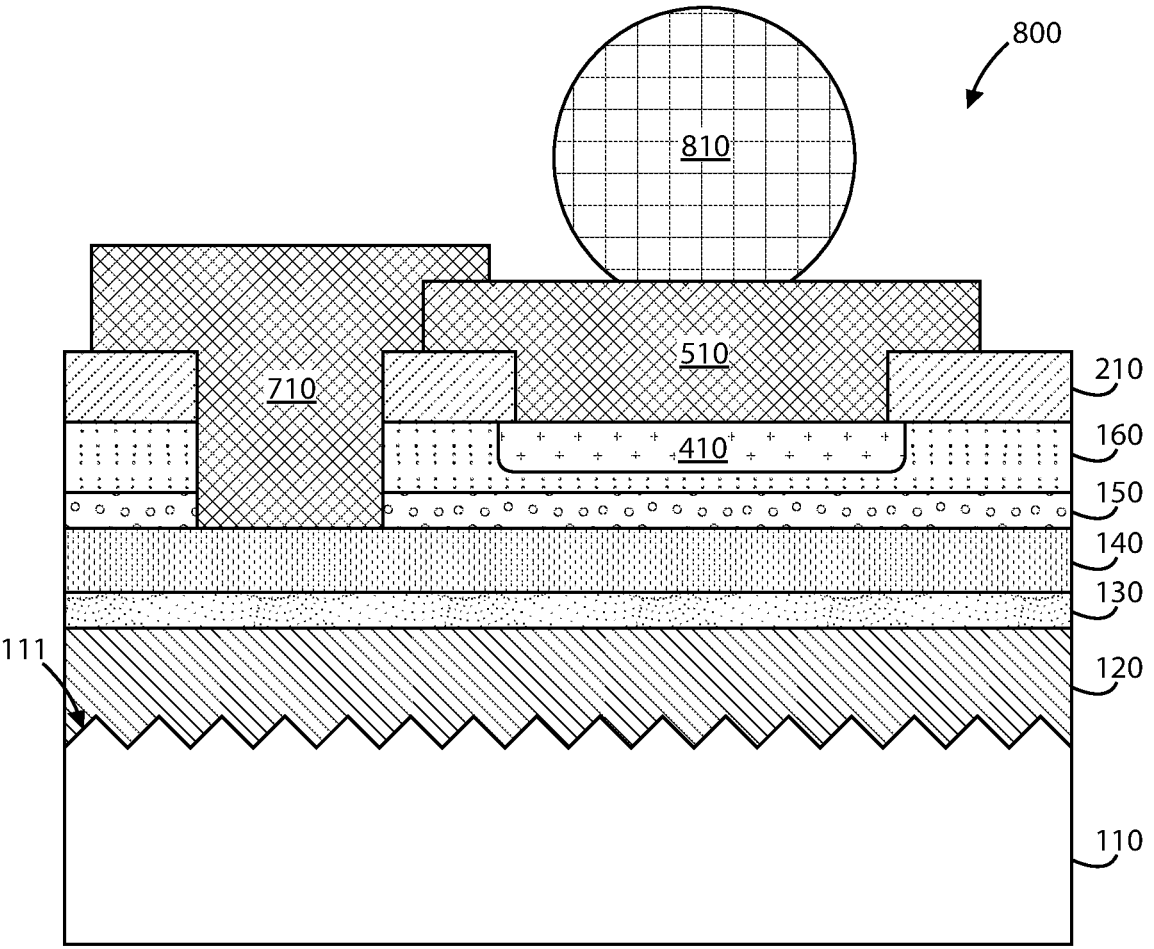

FIG. 8 is a simplified diagram illustrating an example method of forming a bump material 810 overlying the p-type metal contact region 510, resulting in device 800. In an example, the solder bump material 810 can include solder, gold, conductive epoxy, copper, or the like.

Figure 9:
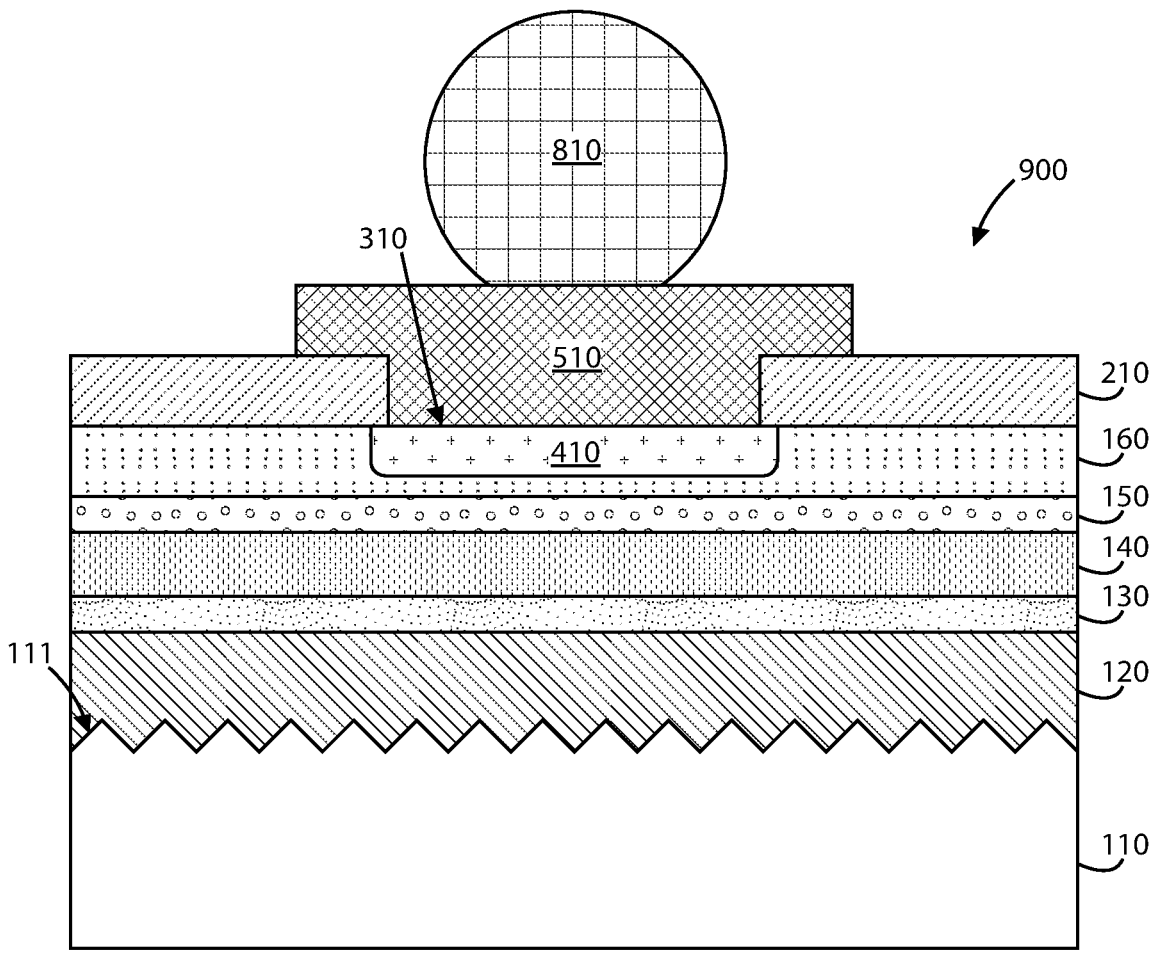
FIG. 9 is a simplified diagram of a sensor device according to an example of the present invention.

FIG. 9 is a simplified diagram illustrating a sensor device 900 according to an example of the present invention. As shown, device 900 includes an example sensor element with the bump material 810 shown in FIG. 8, but without the n-type contact opening 610 and n-type metal contact region 710 shown in FIGS. 6 and 7. These sensor elements can be configured on the same device as the sensor elements shown in FIG. 8 such that the common n-type electrode of device 800 serves as the n-type electrode for device 900.

Figure 10:
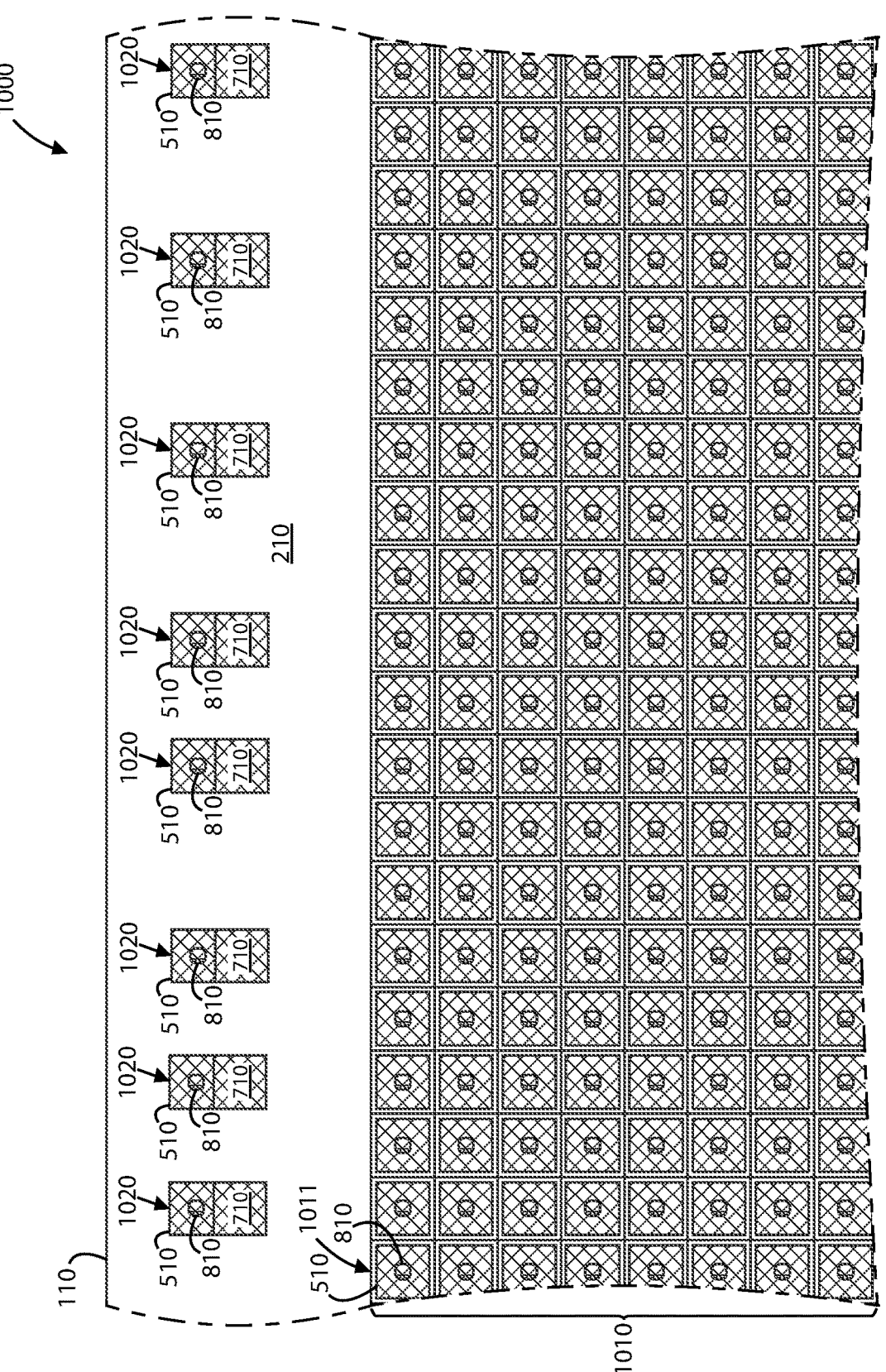
FIG. 10 is a simplified diagram of a sensor array device according to an example of the present invention.

FIG. 10 is a simplified diagram illustrating a portion of a sensor array device 1000 (hidden portions denoted by the dotted lines) according to an example of the present invention. As shown, the sensor array device 1000 includes a pixel array region 1010 of first sensor elements 1011. These first sensor elements 1011 can include devices similar the device 900 shown in FIG. 9, including a p-type metal contact region 510 with an overlying bump material 810. These first sensor elements 1011 can be pixel elements configured within a center portion of the silicon substrate (or partially completed semiconductor substrate).

In an example, the pixel array region 1010 can include one or more isolation trenches separating each of the pixel elements. Also, each of these pixel elements can have a characteristic length ranging from 0.3 micrometers to 50 micrometers.

The array device 1000 can also include one or more second sensor elements 1020, shown to be separated from the first sensor elements 1011 by the dielectric material 210. These second sensor elements 1020 can include devices similar to device 800 shown in FIG. 8, including a p-type metal contact region 510, an n-type metal contact region 710, and a bump material 810. Also, these second sensor elements 1020 can be configured on an exterior region of the silicon substrate (or partially completed semiconductor substrate). As discussed previously, the n-type and p-type metal contact regions of the second sensor elements 1020 can form a common n-type electrode. Thus, these second sensor elements 1020 can be configured as cathode regions in which each of the cathode regions are connected to each other to form a common cathode element.

Alternatively, the first sensor elements 1011 can have n-type metal contact regions (i.e., flipping the n-type and p-type materials) and the second sensor elements 1020 can be configured as common p-type electrodes. Thus, the second sensor elements 1020 would be configured as anode regions in which each of the anode regions are connected to each other to form a common anode element. Those of ordinary skill in the art will recognize other variations, modifications, and alternatives to these steps.

The techniques of the present invention can be used to manufacture various optoelectronic devices in high volumes by leveraging Si manufacturing methods. These devices include, but are not limited to, lasers that are either edge-emitting or vertical cavity surface emitting, optical modulators, photodetectors or photodiodes, semiconductor optical amplifiers, and nonlinear devices for optical comb or frequency generation. Specific to image sensors and photodetector circuit arrays, various device structures could be realized by heteroepitaxy deposition of device layers and subsequent fabrication steps. These device structures include, but are not limited to, planar photodiodes, mesa photodiodes, double mesa photodiodes, PIN or NIP photodiodes, avalanche photodiodes (APDs), and uni-traveling-carrier (UTC) photodiodes.

The optoelectronic devices and device arrays realized with deposition of semiconductor materials on Si can be leveraged in various applications, including, but not limited to, LIDAR; LIDAR for autonomous vehicles including, but not limited to, automobiles, aerial vehicles, airplanes, jets, drones, robotic vehicles; advanced driver assistance systems (ADAS); LIDAR for mobile devices including, but not limited to, phones and tablets; imaging for camera applications including, but not limited to, digital cameras, mobile phones, tablets; imaging and perception for robots, artificial intelligence (AI) applications, augmented reality (AR) applications, and virtual reality (VR) applications; 3D imaging and sensing; defense and aerospace; industrial vision, factory automation; medical and biomedical imaging; topography, weather, and wind mapping; gas sensing; infrared (IR) imaging; smart building, security, people counting; thermal imaging, thermography; heating, and ventilation and air conditioning (HVAC).

FIGS. 11A to 11J are simplified diagrams illustrating a method of fabricating a sensor device according to an example of the present invention. In these figures, shared reference numerals in subsequent figures refer to the same elements as described in previous figures. Further, with regard to the method discussed below, steps may be added, removed, rearranged, or combined depending upon the application.

Figure 11A:
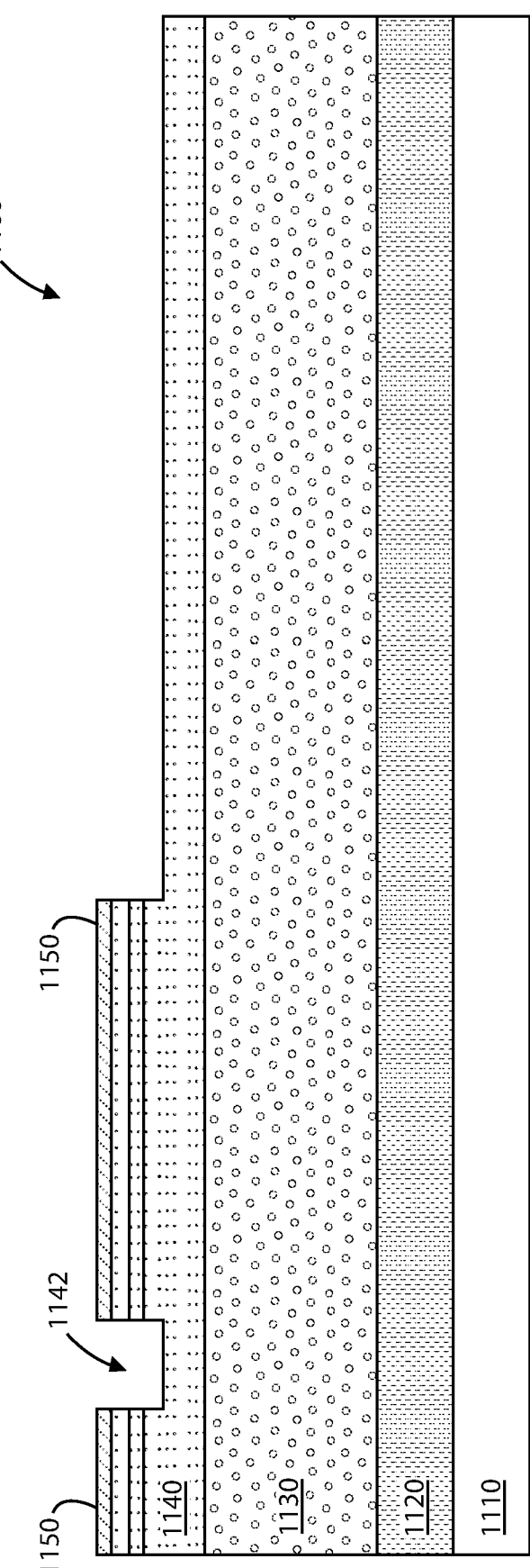
FIGS. 11A to 11J are simplified diagrams illustrating a method of fabricating a sensor device according to an example of the present invention.

FIG. 11A is a simplified diagram illustrating a cross-sectional view of a method step of etching the sensor device 1100 according to an example of the present invention. As shown, device 1100 includes a substrate 1110 with photodetector device materials 1120-1140 formed overlying. These device materials include at least an n-type semiconductor material 1120, a transition material 1130, and a UID optically transparent semiconductor material 1140, respectively. Further, a first dielectric material 1150 is formed overlying at least a portion of the transparent semiconductor material 1140. These materials can include the respective material compositions discussed for previous figures. Here, the method step includes etching one or more portions of the first dielectric material 1150 and the transparent semiconductor material 1140, which includes forming a trench region 1142 within a portion of the transparent semiconductor material 1140. In a specific example, the etching process can include an inductively coupled plasma (ICP) dry etching process, a reactive ion etching (RIE) process, or the like.

Figure 11B:
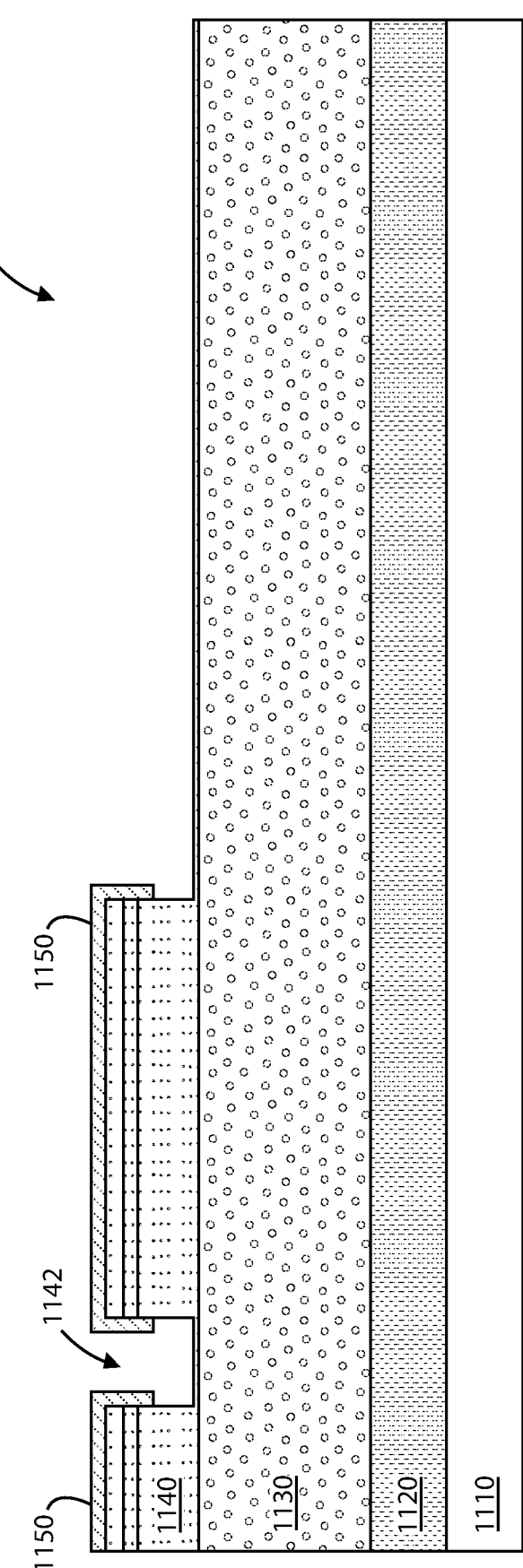

FIG. 11B is a simplified diagram illustrating a cross-sectional view of a method step of etching the sensor device

1100 according to an example of the present invention. As shown, the device 1100 is further etched to removes one or more portions of the transparent semiconductor material 1140, including deepening the trench region 1142. The etching processes can include dry etching (e.g., ICP, RIE, etc.) or wet etching processes. Further, first dielectric materials 1150 can be formed to extend around the edges of the unetched portions of the transparent semiconductor material 1140 and within a portion of the trench region 1142.

Figure 11C:
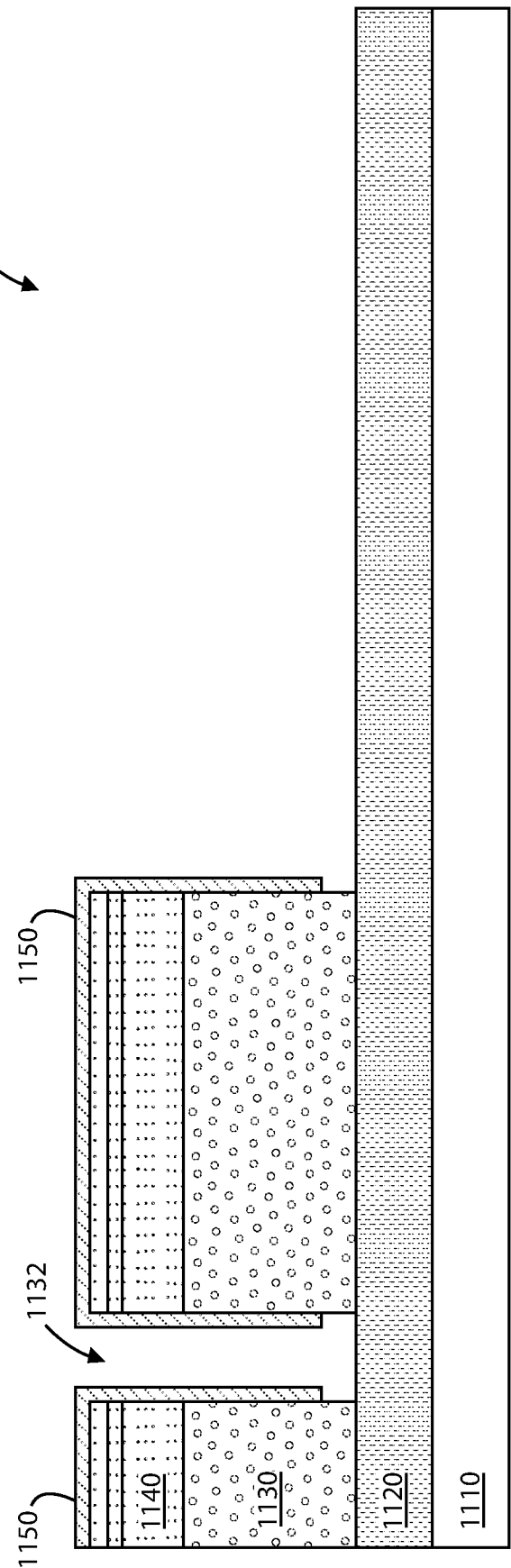

FIG. 11C is a simplified diagram illustrating a cross-sectional view of a method step of etching the sensor device 1100 according to an example of the present invention. As shown, the device 1100 is further etched to remove one or more portions of the transition material 1130, including deepening the trench region 1142 to form the trench region 1132. Further, first dielectric materials 1150 can be formed to extend around the edges of the unetched portions of the transparent semiconductor material 1140 and the transition material 1130, as well as within a portion of the trench region 1132.

Figure 11D:
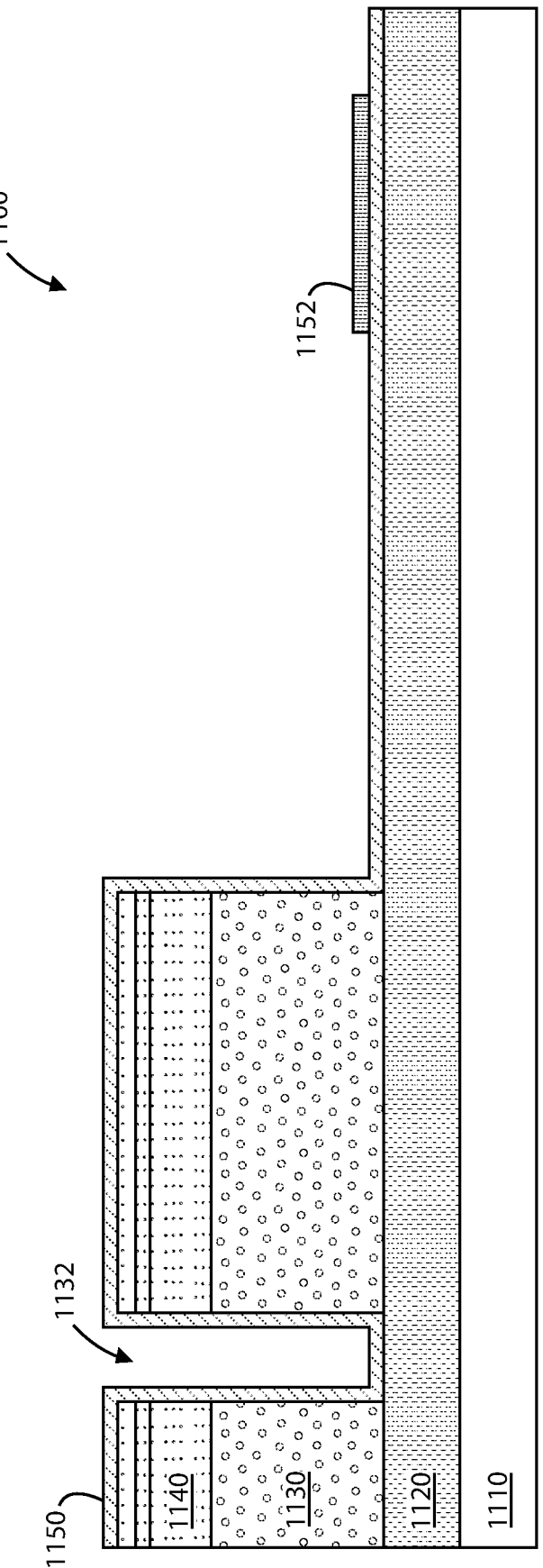

FIG. 11D is a simplified diagram illustrating a cross-sectional view of a method step of forming dielectric materials 1150 and a mask region 1152 overlying a portion of the sensor device 1100 according to an example of the present invention. As shown, the method step includes forming dielectric materials 1150 overlying the device 1100 and forming the mask region 1152 overlying at least a portion of the first dielectric material 1150 and the n-type material 1120. This portion can be a region where portions of the transition material 1130 and transparent semiconductor material 1140 were removed by previous etching processes.

Figure 11E:
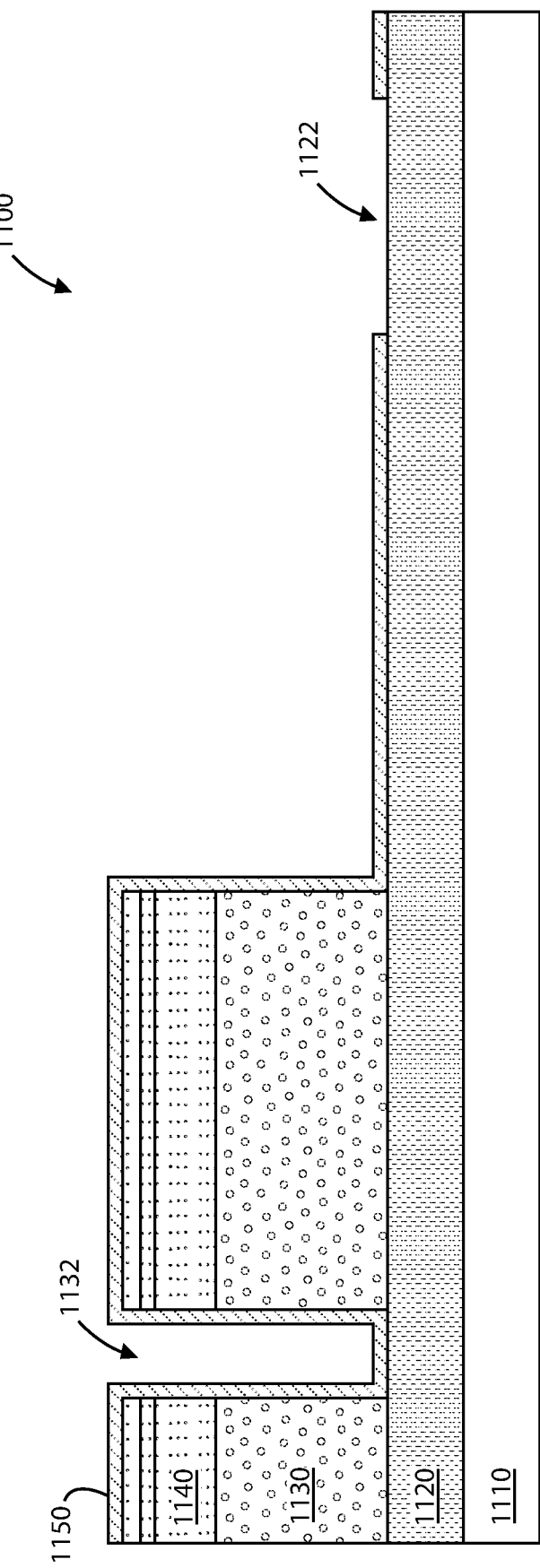

FIG. 11E is a simplified diagram illustrating a cross-sectional view of a method step of etching the sensor device 1100 according to an example of the present invention. As shown, the device 1100 is etched to form an opening within the first dielectric material 1150 defined by the mask region 1152. This mask region 1152 is used to define a first active region 1122 that will become a cathode contact region.

Figure 11F:
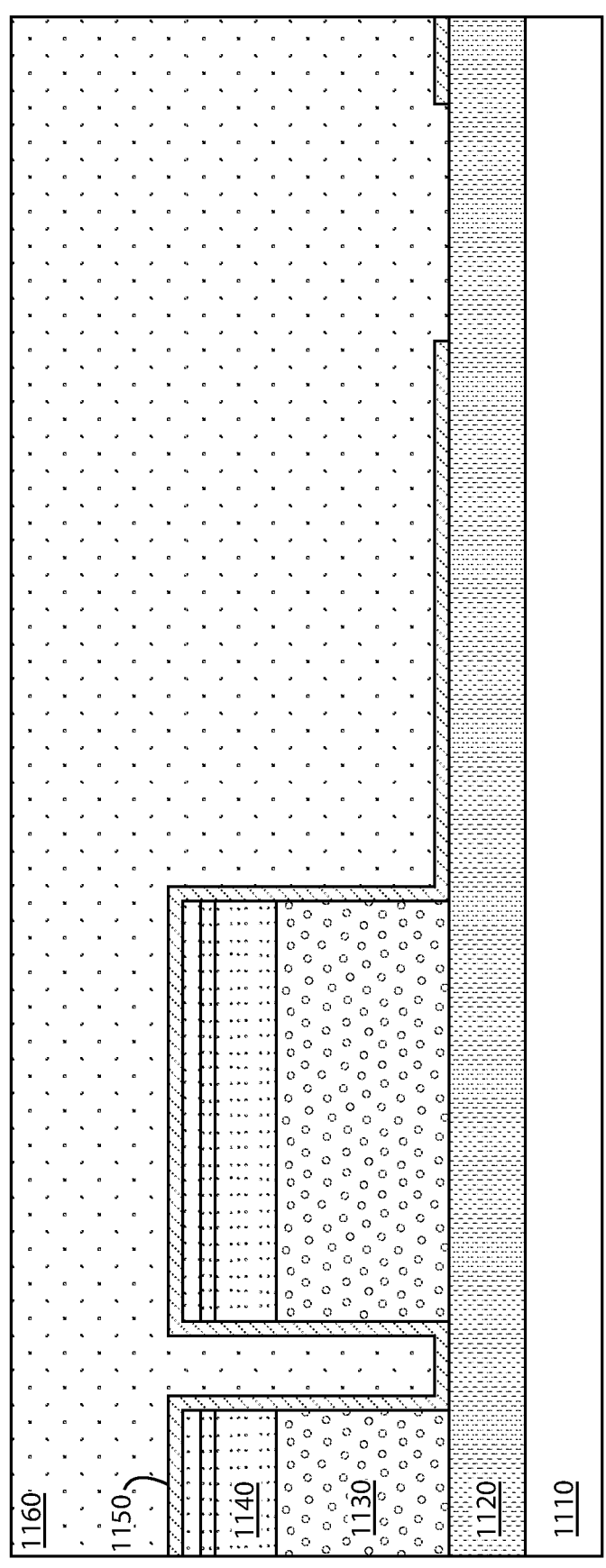

FIG. 11F is a simplified diagram illustrating a cross-sectional view of a method step of forming a second dielectric material 1160 overlying the sensor device 1100 according to an example of the present invention. As shown, the second dielectric material 1160 is formed overlying the first dielectric material 1150 and the active region 1122 (shown in FIG. 11E). Also, the device 1100 is subjected to a planarization process to smooth the top surface region of the second dielectric material 1160. In a specific example, the second dielectric material includes a silicon dioxide material, or the like. Also, the planarization process includes a chemical-mechanical planarization (CMP) process, or the like.

Figure 11G:
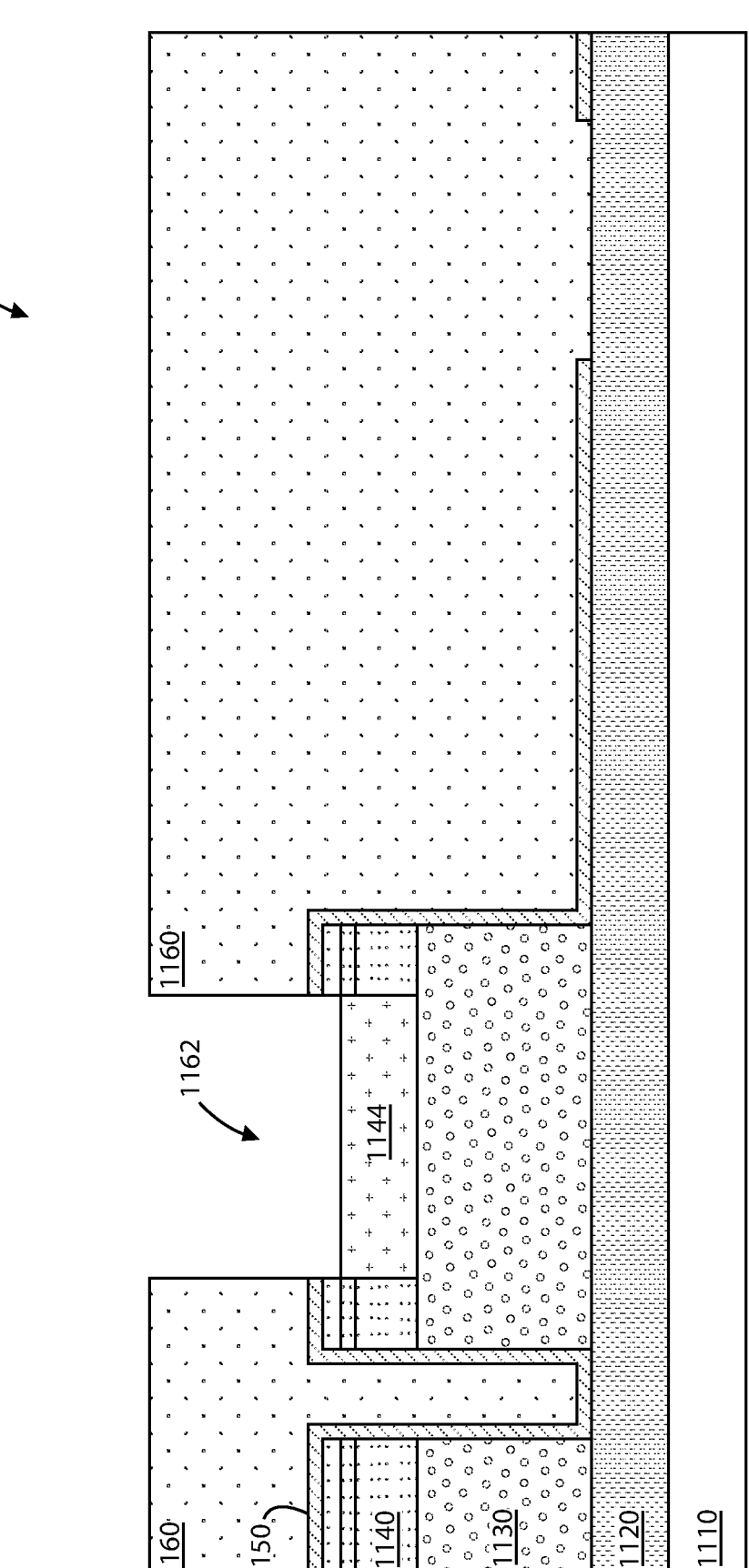

FIG. 11G is a simplified diagram illustrating a cross-sectional view of a method step of etching the sensor device 1100 and forming a p-type region 1142 according to an example of the present invention. As shown, the device 1100 is etched to form a first contact trench region 1162, which includes etching portions of the second dielectric material 1160 and the first dielectric material 1150. In a specific example, this etching process can include a wet etching process, or the like. Then, the p-type region 1144 (i.e., the second active region) is formed within a portion of the transparent semiconductor material 1140. This p-type region formation can include the materials and processes discussed for previous figures. In a specific example, the p-type region 1144 can be formed by Zn diffusion.

Figure 11H:
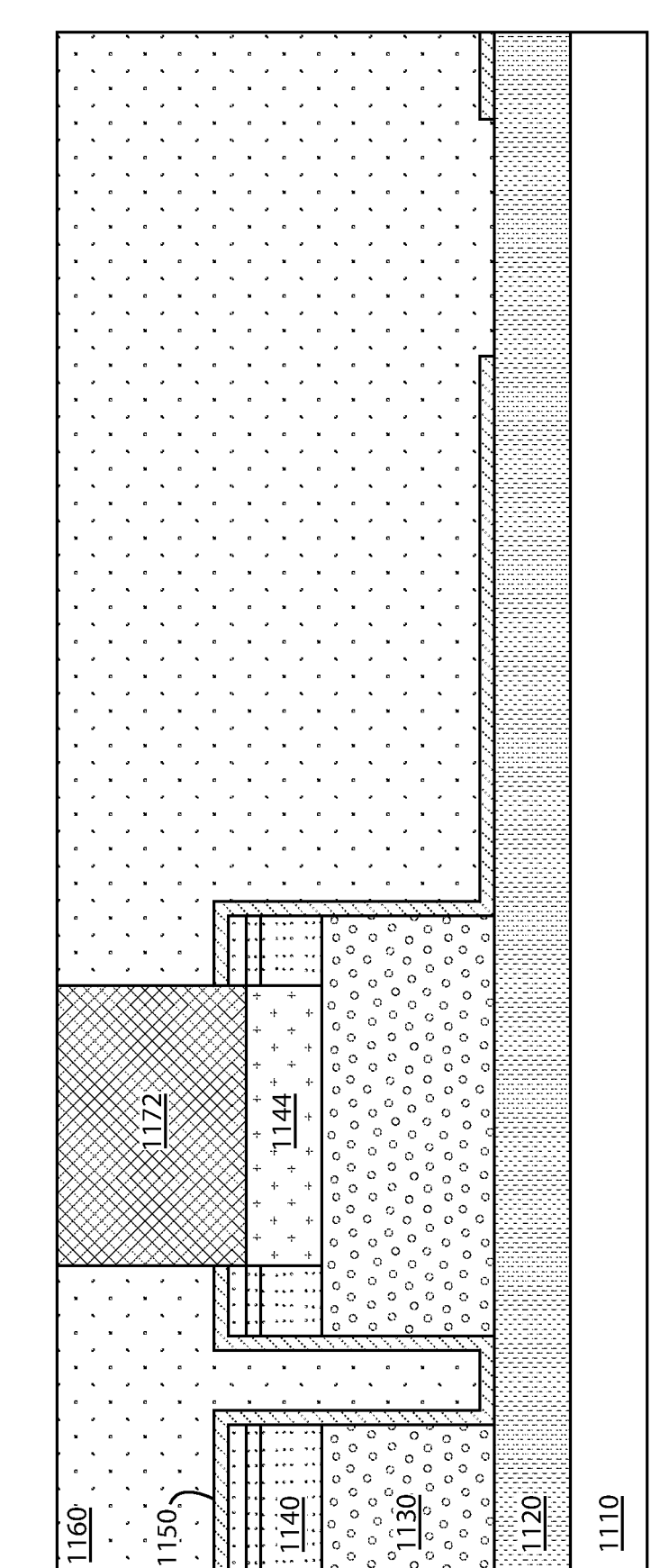

FIG. 11H is a simplified diagram illustrating a cross-sectional view of a method step of forming a p-type contact region within the sensor device 1100 according to an example of the present invention. As shown, a first metal contact material 1172 is formed within the first contact trench region 1162 (see FIG. 11G) overlying the p-type region 1144.

Figure 11I:
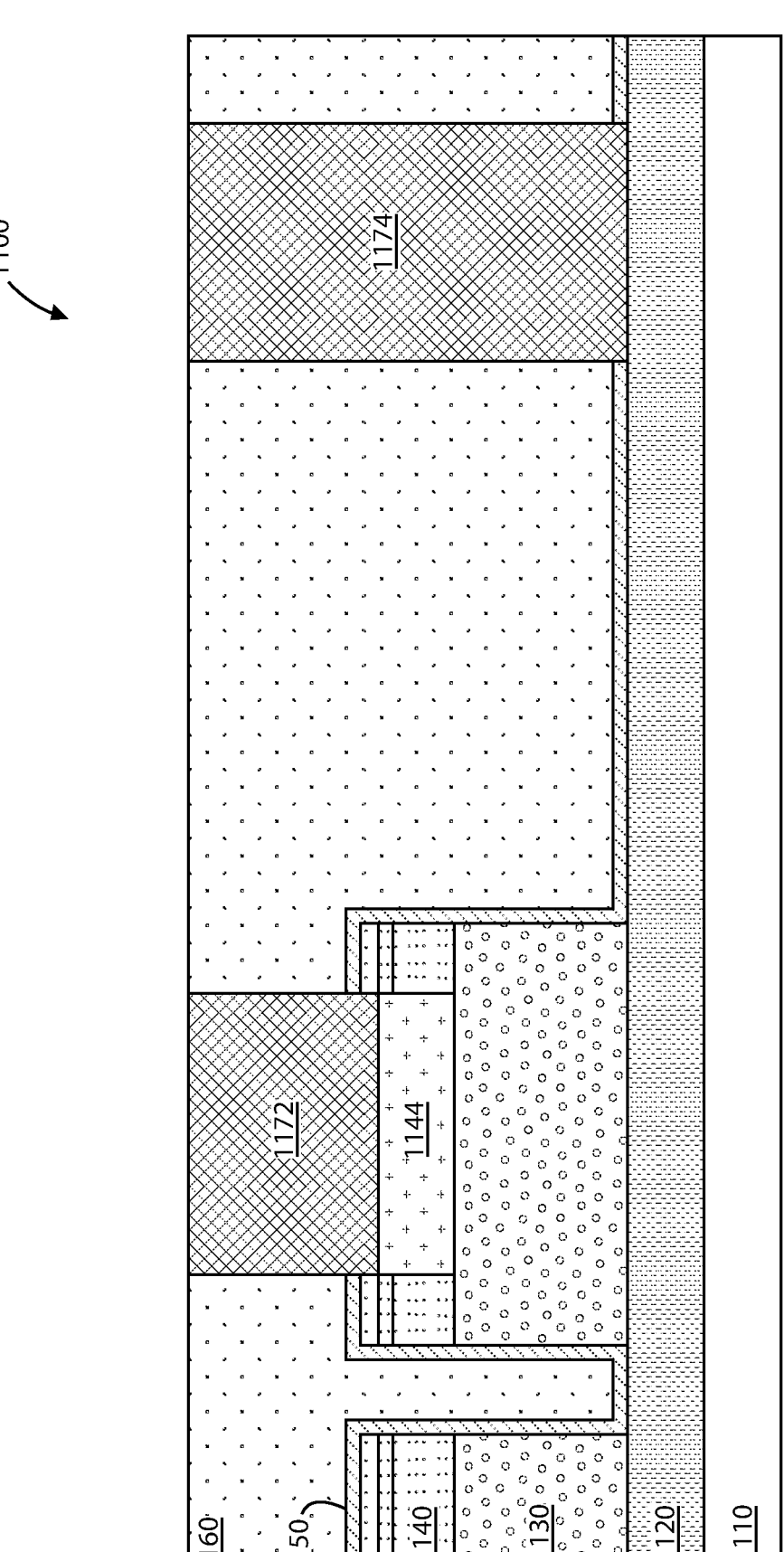

FIG. 11I is a simplified diagram illustrating a cross-sectional view of a method step of forming an n-type contact region within the sensor device 1100 according to an example of the present invention. As shown, the method includes forming a second metal contact material 1174 overlying the first active region 1122 of the n-type material 1120. Similar to the previous step, this formation process can include etching a second contact trench region overlying the first active region 1122 before forming the second metal contact material 1174.

Figure 11J:
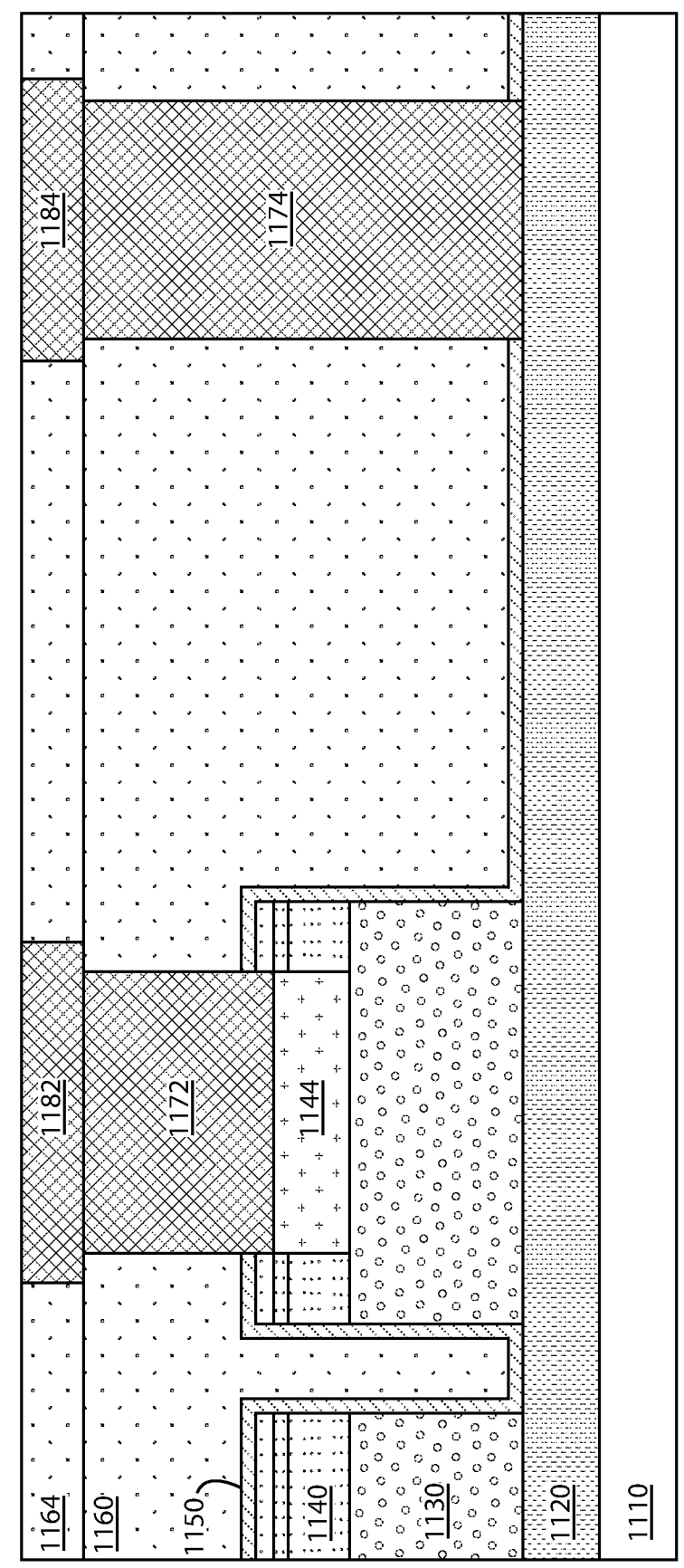

FIG. 11J is a simplified diagram illustrating a cross-sectional view of a method step of bond pads for the sensor device 1100 according to an example of the present invention. As shown, a first bond pad 1182 is formed overlying the first metal contact material 1172 and second bond pad 1184 is formed overlying the second metal contact material 1174. Here, the first bond pad 1182 is configured as a p-type bond pad, and the second bond pad 1184 is configured as an n-type bond pad. Further, a third dielectric material 1164 can be formed overlying the second dielectric material 1160, and one or more portions of this third dielectric material 1164 overlying the first and second metal contact materials 1172, 1174 can be removed (e.g., etched) to define one or more regions to form first and second bond pads 1182 and 1184.

In these method steps, the etching processes can include wet etching, dry etching, or other similar processes. Also, the masking processes can include optical lithography, electron beam lithography, soft lithography, direct write lithography, or the like. Those of ordinary skill in the art will recognize other variations, modifications, and alternatives to the steps described previously.

Figure 12A:
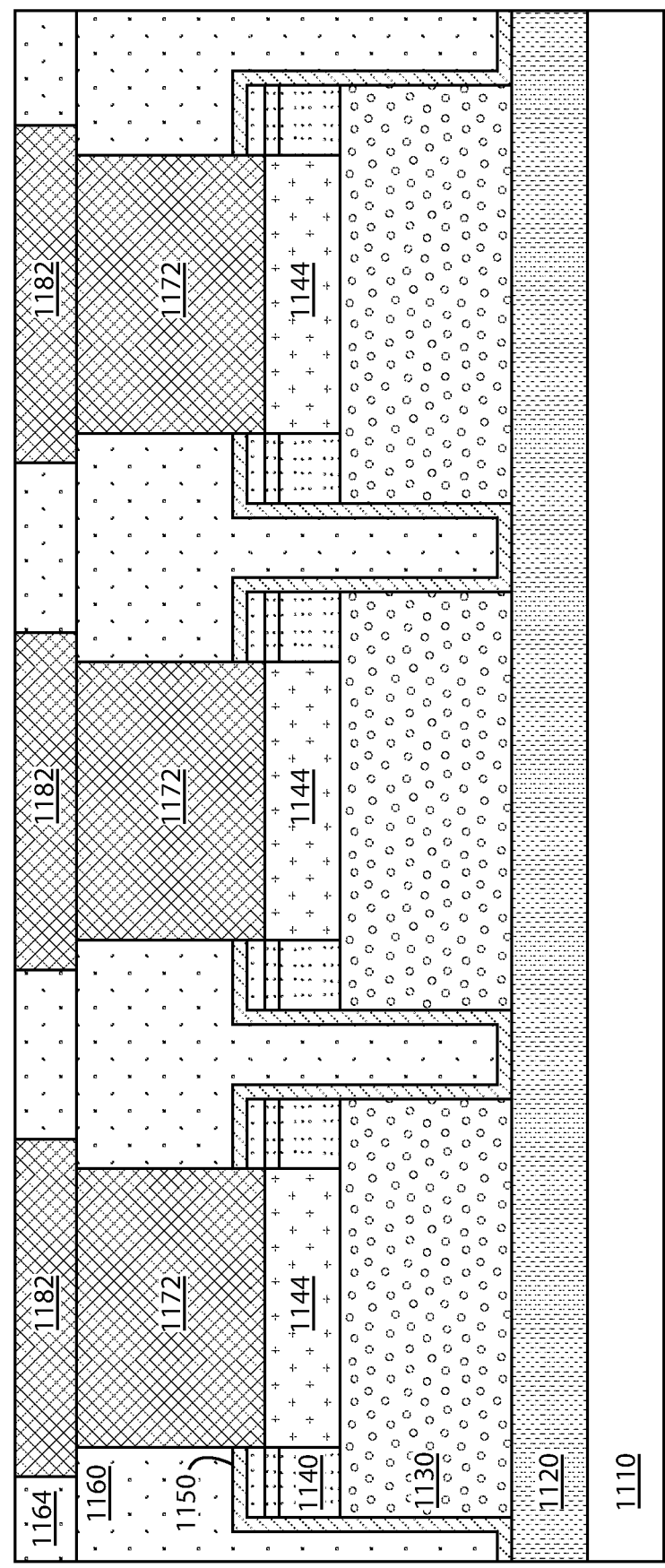
FIGS. 12A to 12B are simplified diagrams illustrating a sensor array device according to examples of the present invention.
Figure 12B:
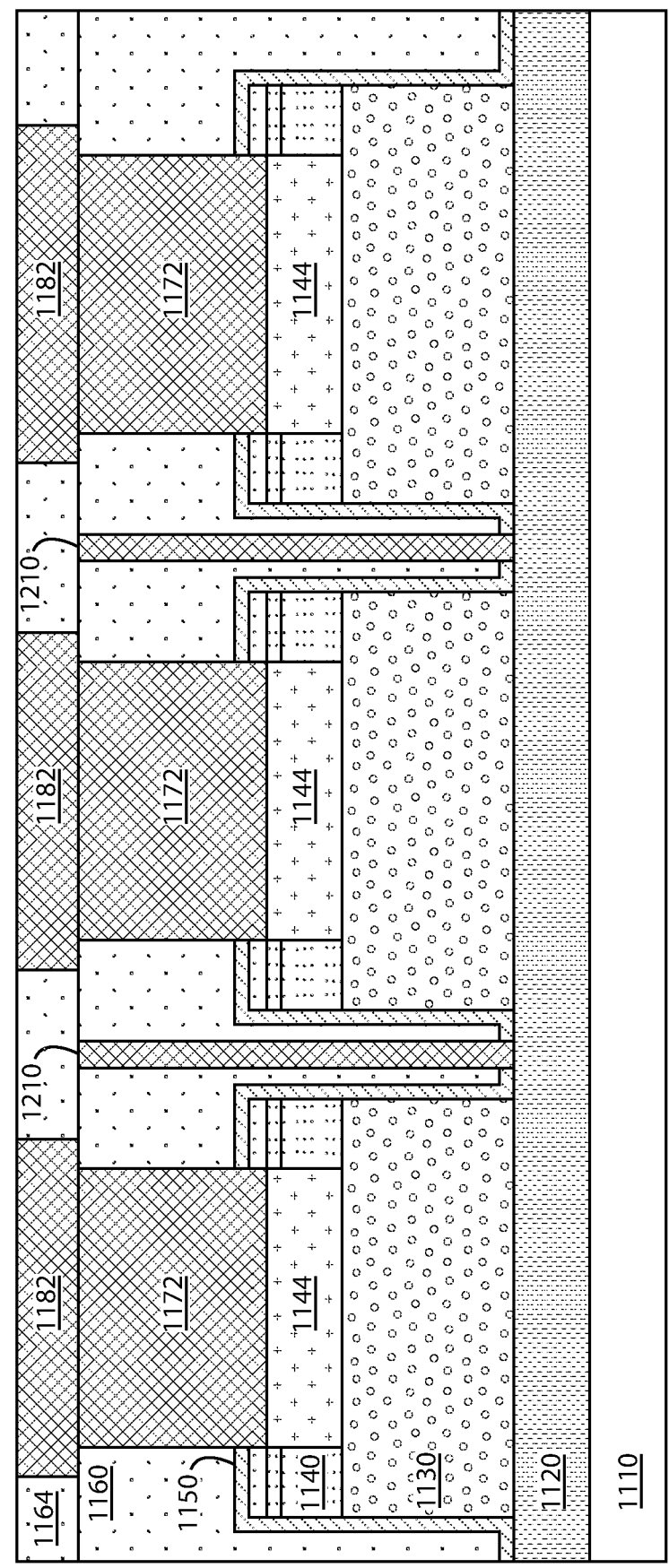

FIGS. 12A to 12B are simplified diagrams illustrating a sensor array device with device isolation according to examples of the present invention. In these figures, shared reference numerals in subsequent figures refer to the same elements as described in previous figures. Further, with regard to the device discussed below, materials and components discussed for other examples of the present invention may be included here as well.

FIG. 12A is a simplified diagram illustrating a cross-sectional view of a sensor array device 1201 according to an example of the present invention. As shown, three sensor devices are configured next to each other while being separated by trenches (similar to trench 1132 in FIG. 11D). These sensor devices are similar to the sensor device 1100 shown previously in FIGS. 11A to 11J, but without the n-type contact region.

FIG. 12B is a simplified diagram illustrating a cross-sectional view of a sensor array device 1202 according to an example of the present invention. Similar to FIG. 12A, three sensor devices are configured next to each other while being separated by trenches. However, in this case, metal fill materials 1210 are spatially configured within the trench regions extending to the top of the second dielectric material 1160. These metal fill materials 1210 may be configured to isolate the sensor devices from each other (e.g., pixel isolation).

Figure 13:
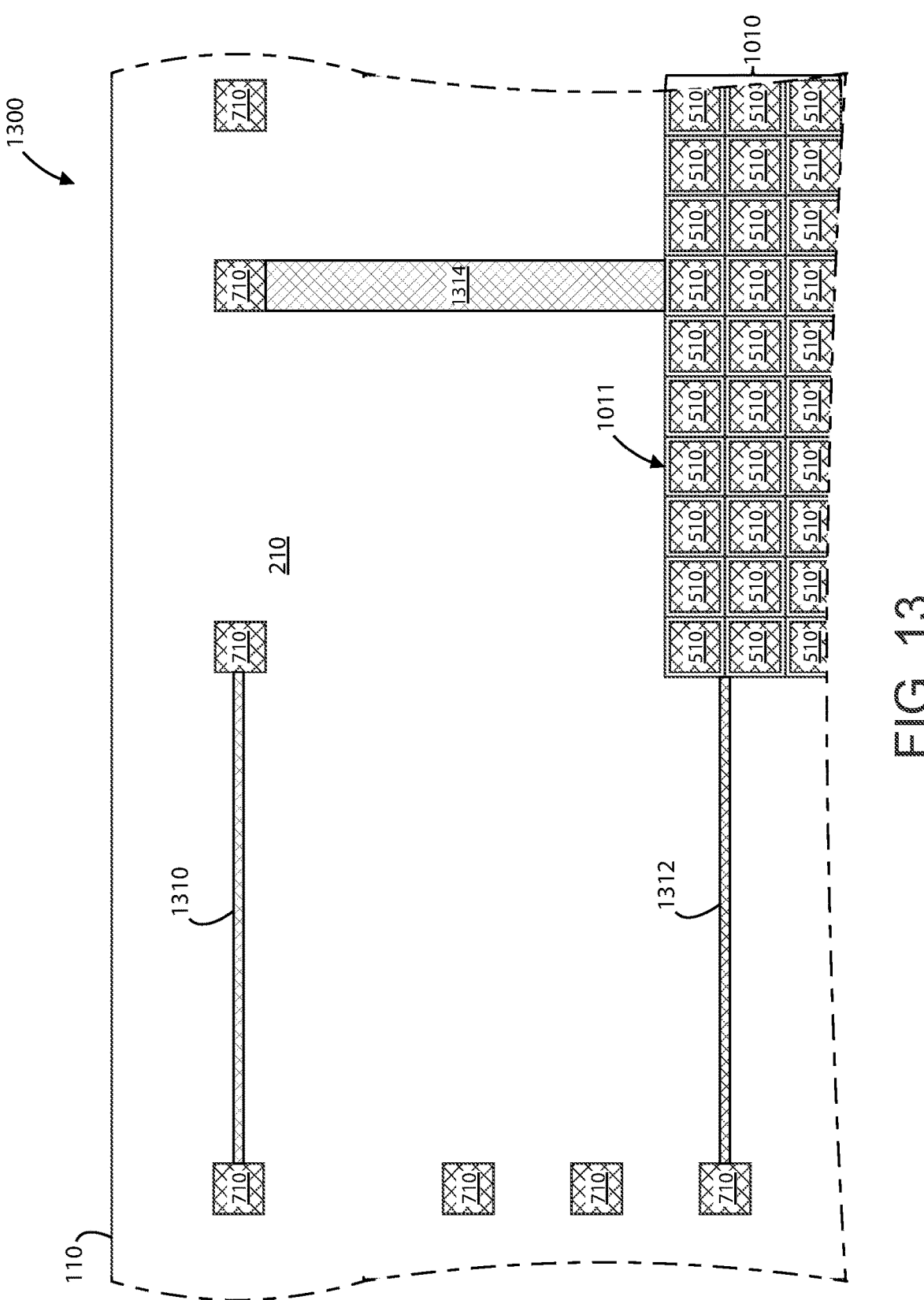
FIG. 13 is a simplified diagram illustrating a sensor array device with device isolation according to an example of the present invention.

FIG. 13 is a simplified diagram illustrating a sensor array device using metalized trenches according to an example of the present invention. In these figures, shared reference numerals in subsequent figures refer to the same elements as described in previous figures. Further, with regard to the device discussed below, materials and components discussed for other examples of the present invention may be included here as well.

As shown, the sensor array device 1300 includes n-type metal contact regions 710 and a pixel array region 1010 of first sensor elements 1011 with p-type metal contact regions 510. In an example, metalized trenches may be used to connect to the n-type metal contact regions 710 wherever needed. The metalized trench 1310 is coupled between two n-type contacts 710, while the metalized trench 1312 is coupled between an n-type contact 710 and the array 1010. A thicker metalized trench 1314 is coupled between another n-type contact 710 and the array 1010. These metalized trenches can be configured to increase the current spread uniformity across the whole array 1010. Further details are discussed with respect to FIGS. 14A to 14B.

Figure 14A:
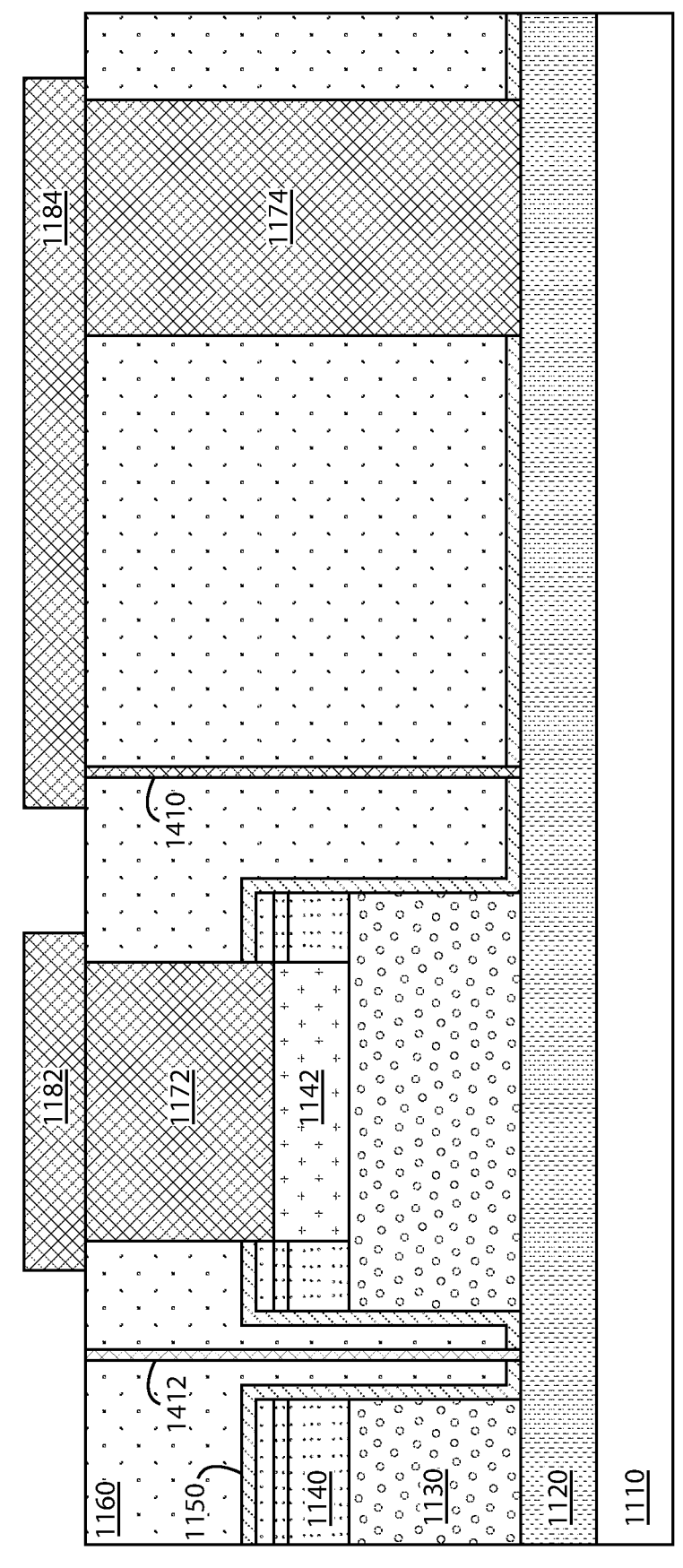
FIGS. 14A to 14B are simplified diagrams illustrating a sensor device with device isolation using metalized trenches according to examples of the present invention.
Figure 14B:
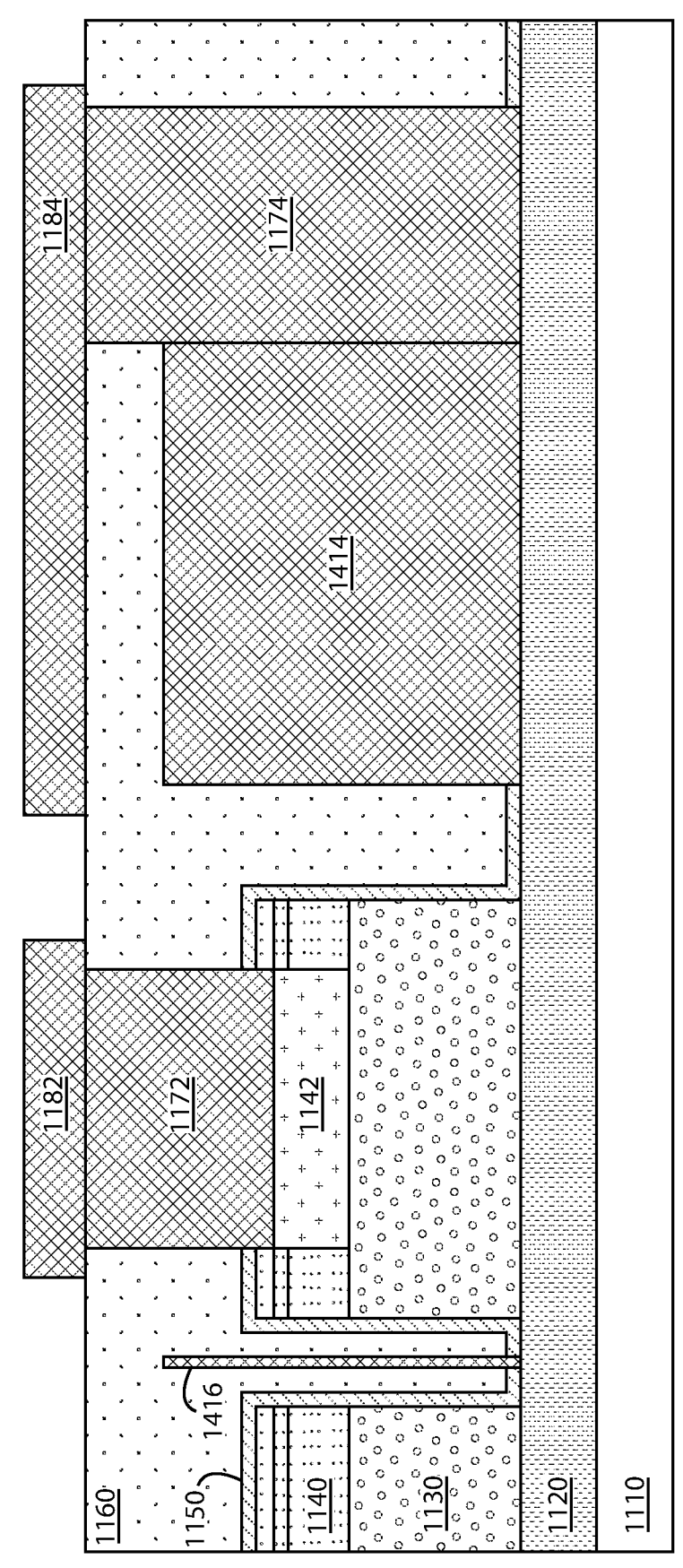

FIGS. 14A to 14B are simplified diagrams illustrating a sensor device using metalized trenches according to examples of the present invention. In these figures, shared reference numerals in subsequent figures refer to the same elements as described in previous figures. Further, with regard to the device discussed below, materials and components discussed for other examples of the present invention may be included here as well.

FIG. 14A is a simplified diagram illustrating a cross-sectional view of a sensor device 1401 with a metalized trench according to an example of the present invention. This device 1401 is similar to device 1100 except that the second bond pad 1184 is extended across a portion of the second dielectric material 1160 closer to the first bond pad 1182 and there is an additional trench with a third metal contact material 1410 extending from the second bond pad 1184 to the n-type semiconductor material 1120. Also, a fourth metal contact material 1412 is configured within the trench on the other side that extends from the n-type semiconductor material 1120 to the top of the second dielectric material 1160.

FIG. 14B is a simplified diagram illustrating a cross-sectional view of a sensor device 1402 with a metalized trench according to an example of the present invention. This device 1401 is similar to device 1100 except that the second bond pad 1184 is extended across a portion of the second dielectric material 1160 closer to the first bond pad 1182 and there is a third metal contact material 1414 configured within a portion of the second dielectric material 1160 underlying the second bond pad 1184 and coupled to both the n-type semiconductor material 1120 and the second metal contact material 1174. Also, a fourth metal contact material 1416 is configured within the trench on the other side that extends from the n-type semiconductor material 1120 to a portion of the second dielectric material 1160 below the top surface. Those of ordinary skill in the art will recognize variations, modifications, and alternatives to these isolation configurations for electrical uniformity.

Figure 15A:
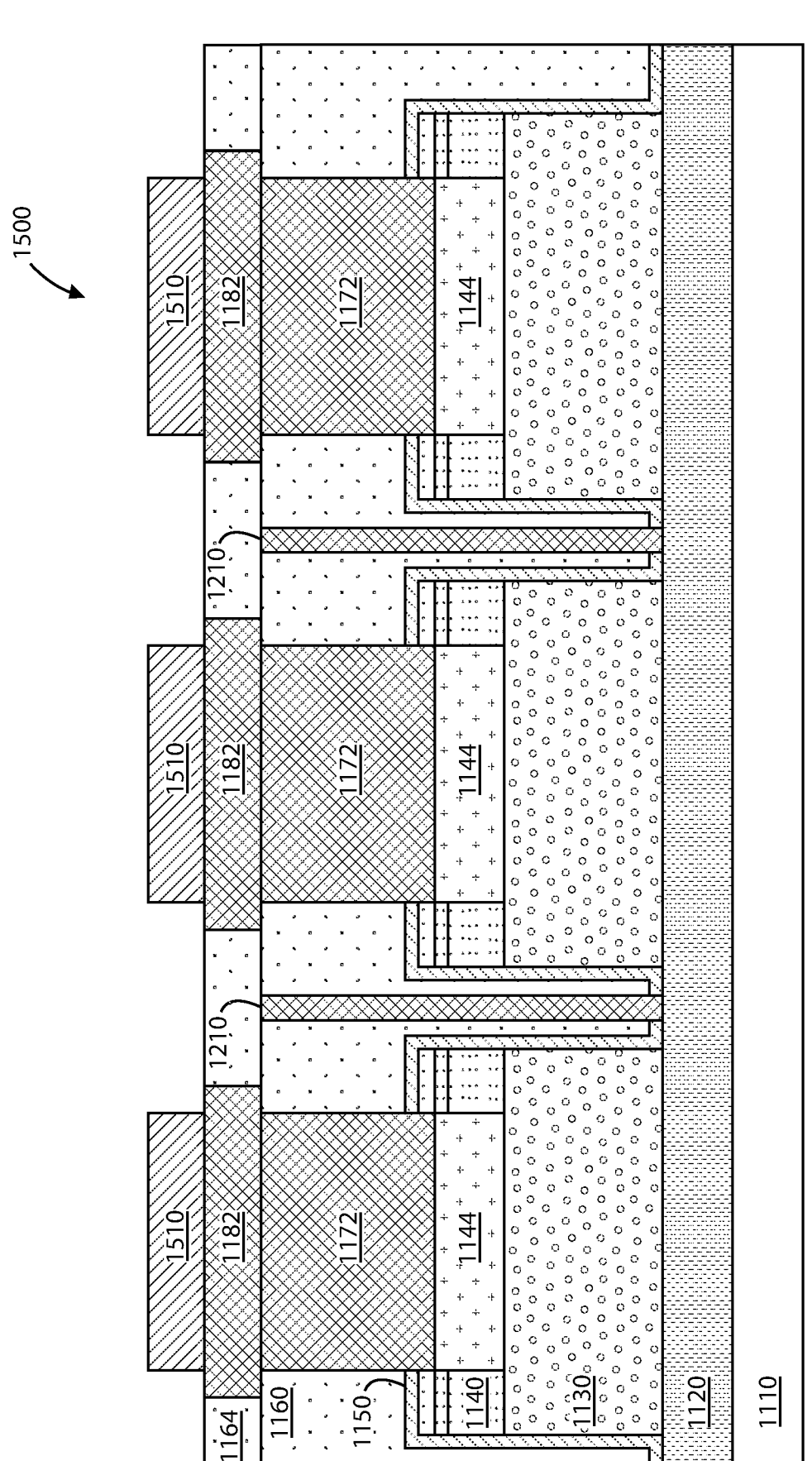
FIGS. 15A to 15C are simplified diagrams illustrating a method of planarization for a sensor array device according to an example of the present invention.
Figure 15B:
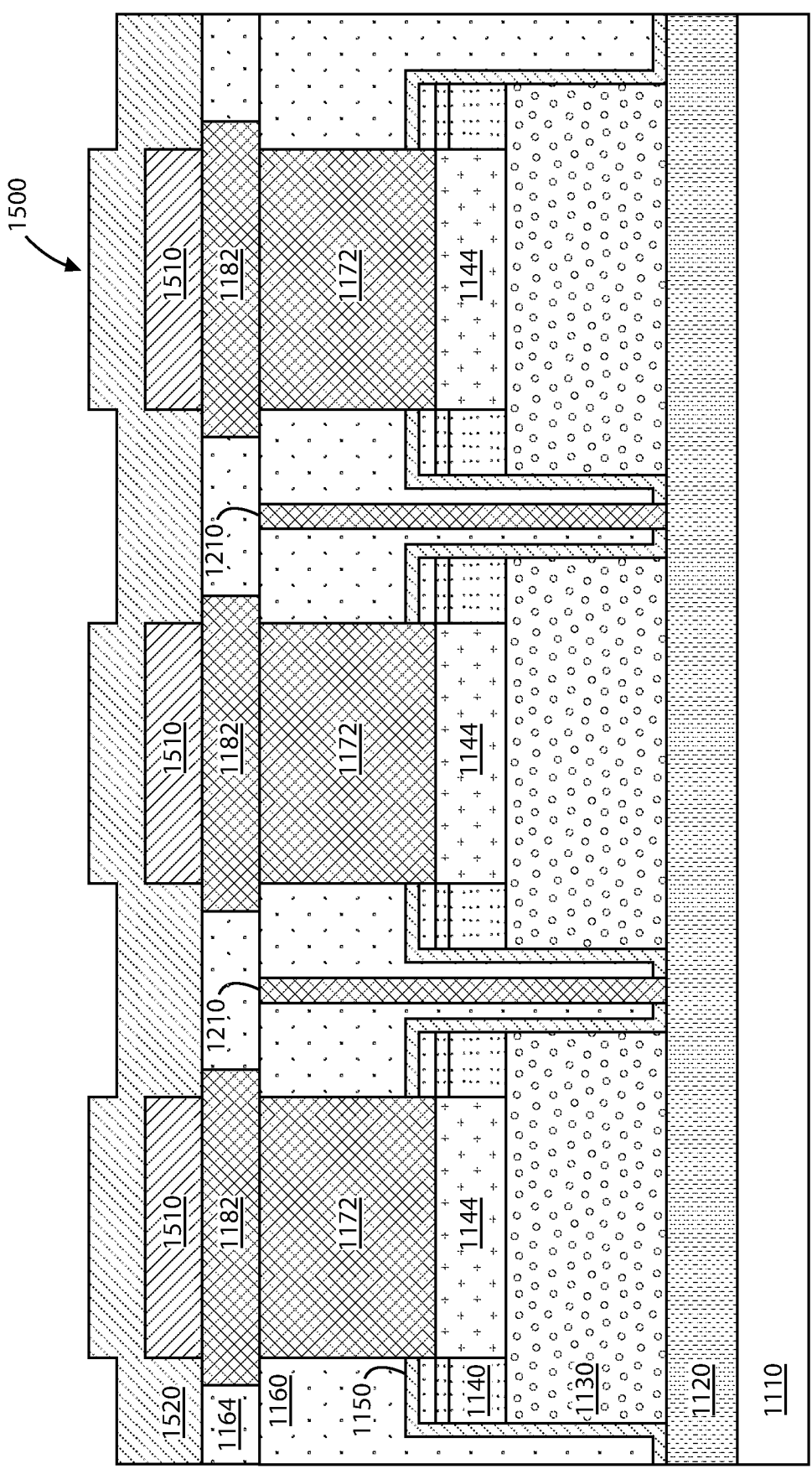
Figure 15C:
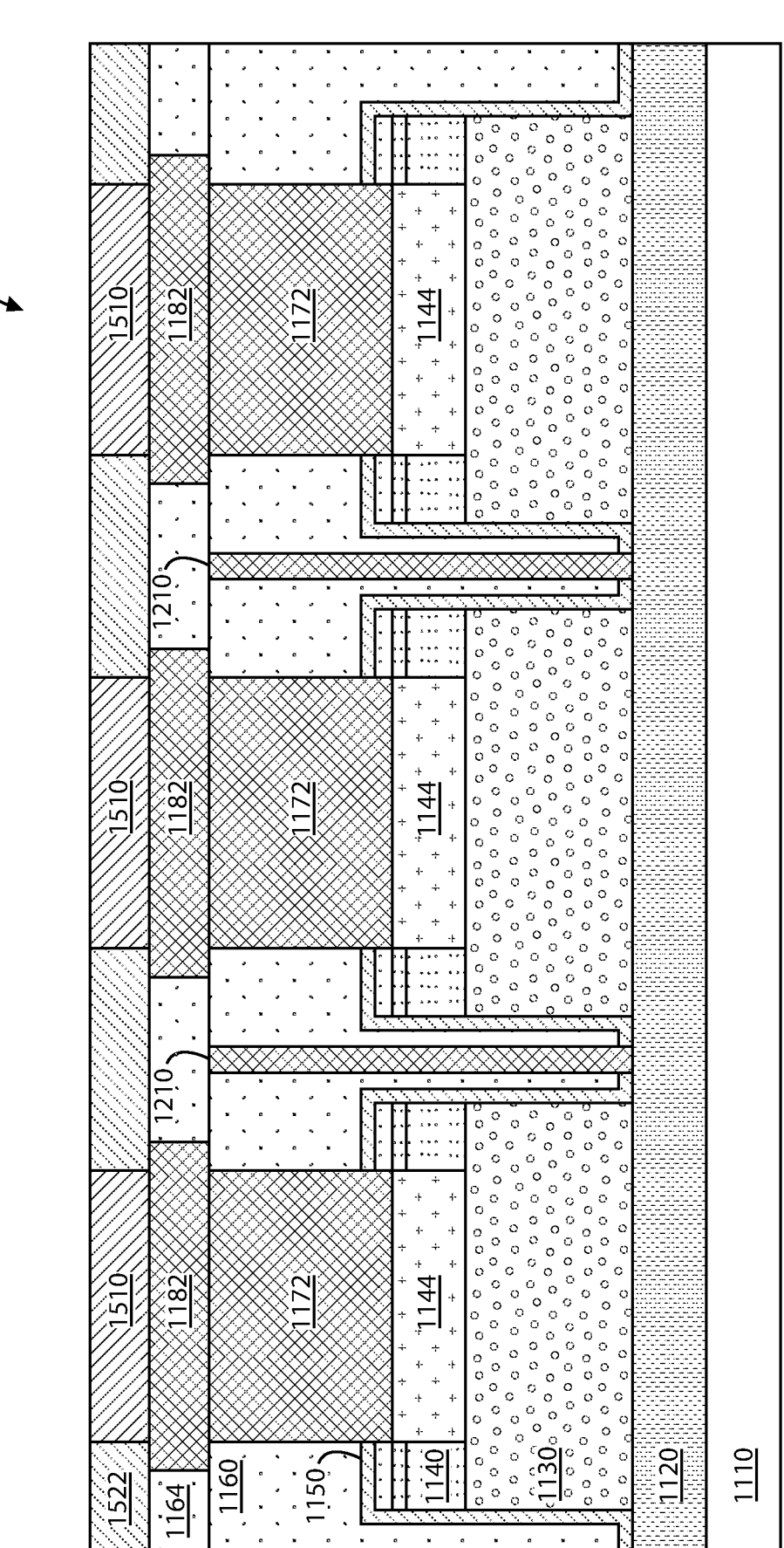

FIGS. 15A to 15C are simplified diagrams illustrating a method of planarization for a sensor device 1500 using according to examples of the present invention. Here, the method includes planarizing a passivation layer after the formation of metal interconnects. In these figures, shared reference numerals in subsequent figures refer to the same elements as described in previous figures. Further, with regard to the device discussed below, materials and components discussed for other examples of the present invention may be included here as well.

FIG. 15A shows a device 1500 that is similar to the device 1202 of FIG. 12B, which includes a plurality of sensor units (e.g., photodetectors, or the like) separated by isolation structures formed by trenches with metal fill materials 1210 formed within. This figure shows a method step of forming a metal interconnect material 1510 overlying each of the first bond pads 1182 of each sensor unit. In a specific example, the metal interconnect materials 1510 can include aluminum, copper, or other similar metal materials.

FIG. 15B shows a method step of forming a passivation material 1520 overlying the metal interconnect materials 1510, the bond pads 1182, and the dielectric materials 1164. The passivation material 1520 can include dielectric materials, oxide materials, and the like. In a specific example, the passivation material 1520 includes a silicon dioxide material. Then, FIG. 15C shows a method step of planarizing the passivation material 1520 to create a smooth top surface across the metal interconnect materials 1510. In a specific example, the planarizing process can include polishing, etching, or other removal processes.

FIGS. 16A to 16D are simplified diagrams illustrating a method of planarization for a sensor device 1600 using according to examples of the present invention. Here, the method includes planarizing a metal interconnect material after the formation of a passivation layer. Compared to method shown in FIGS. 15A to 15C, these steps can be performed following the formation of the metal contact materials 1172 without requiring the formation of the bond pads 1182. In these figures, shared reference numerals in subsequent figures refer to the same elements as described in previous figures. Further, with regard to the device discussed below, materials and components discussed for other examples of the present invention may be included here as well.

Figure 16A:
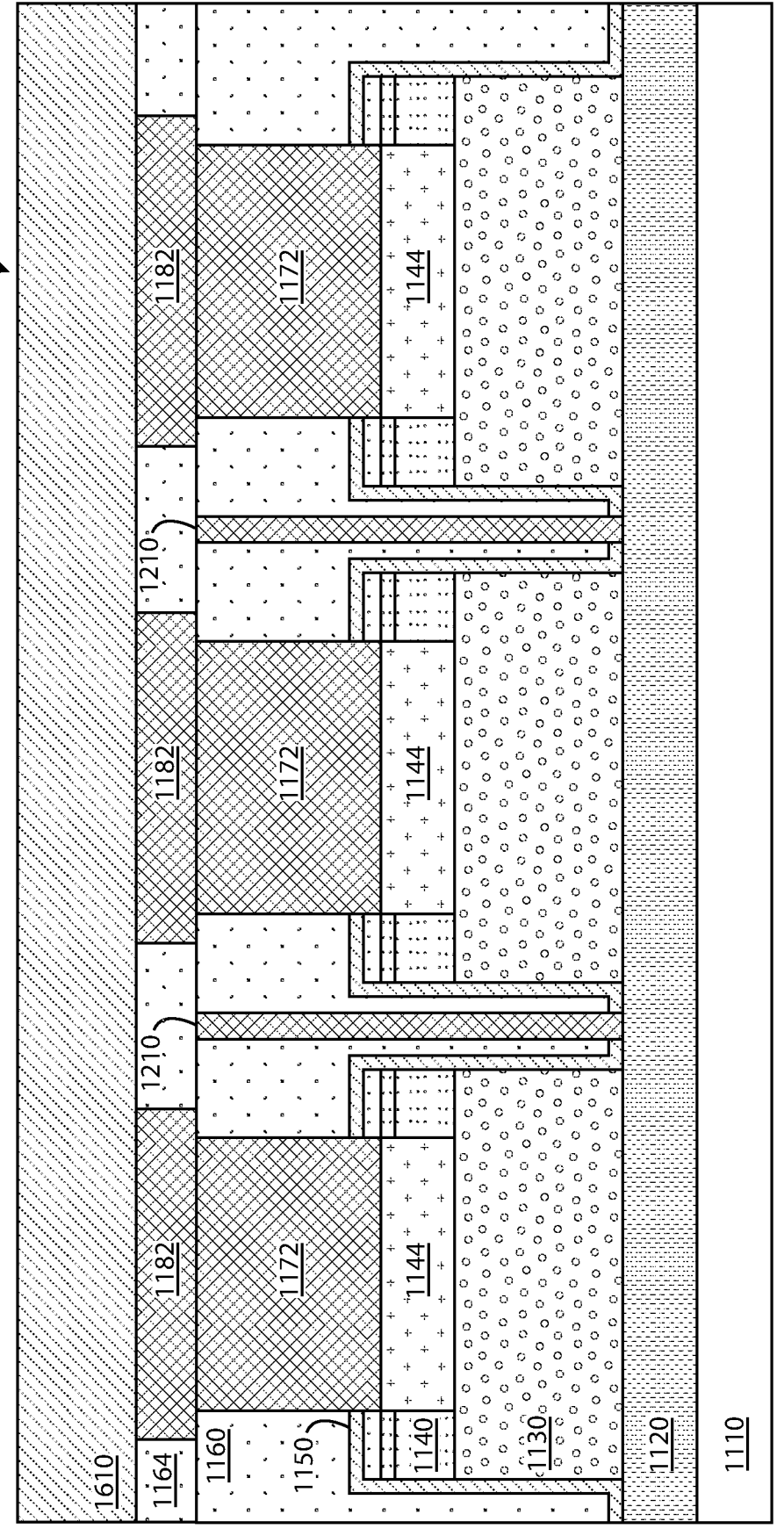
FIGS. 16A to 16D are simplified diagrams illustrating a method of planarization for a sensor array device according to an example of the present invention.
Figure 16B:
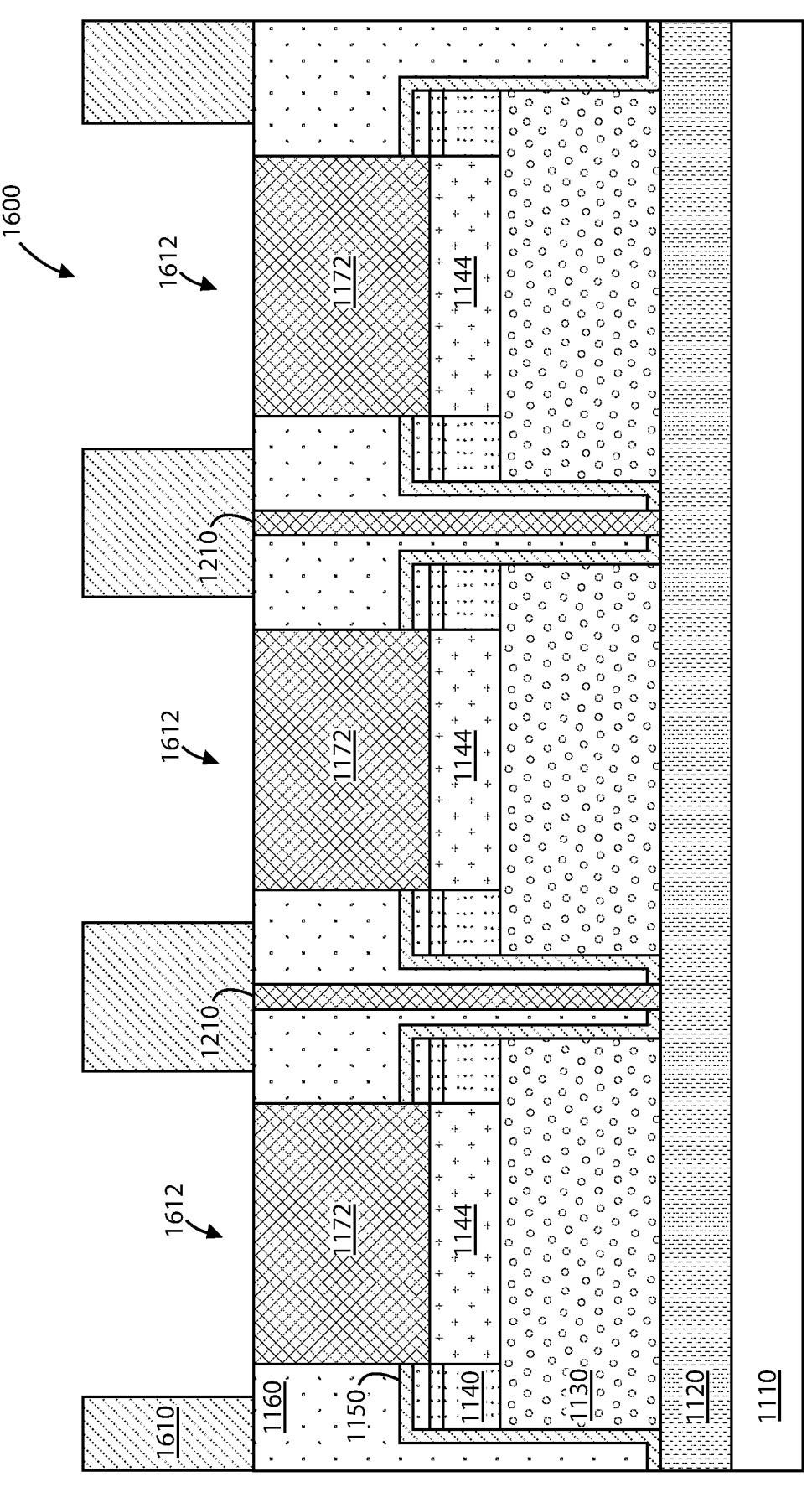

FIG. 16A shows a method step of forming a passivation layer 1610 overlying the metal contact materials 1172 and the dielectric material 1160. As discussed previously, the passivation material 1610 can include a silicon dioxide material, or dielectric materials, oxide materials, and the like. Then, FIG. 16B shows a method step of removing one or more portions of the passivation layer 1610 to form an interconnect footprint cavity 1612 overlying each of the metal contact materials 1172. The cavities 1612 may also extend to one or more portions of the dielectric material 1160 depending on the desired size of the metal interconnect to be formed.

Figure 16C:
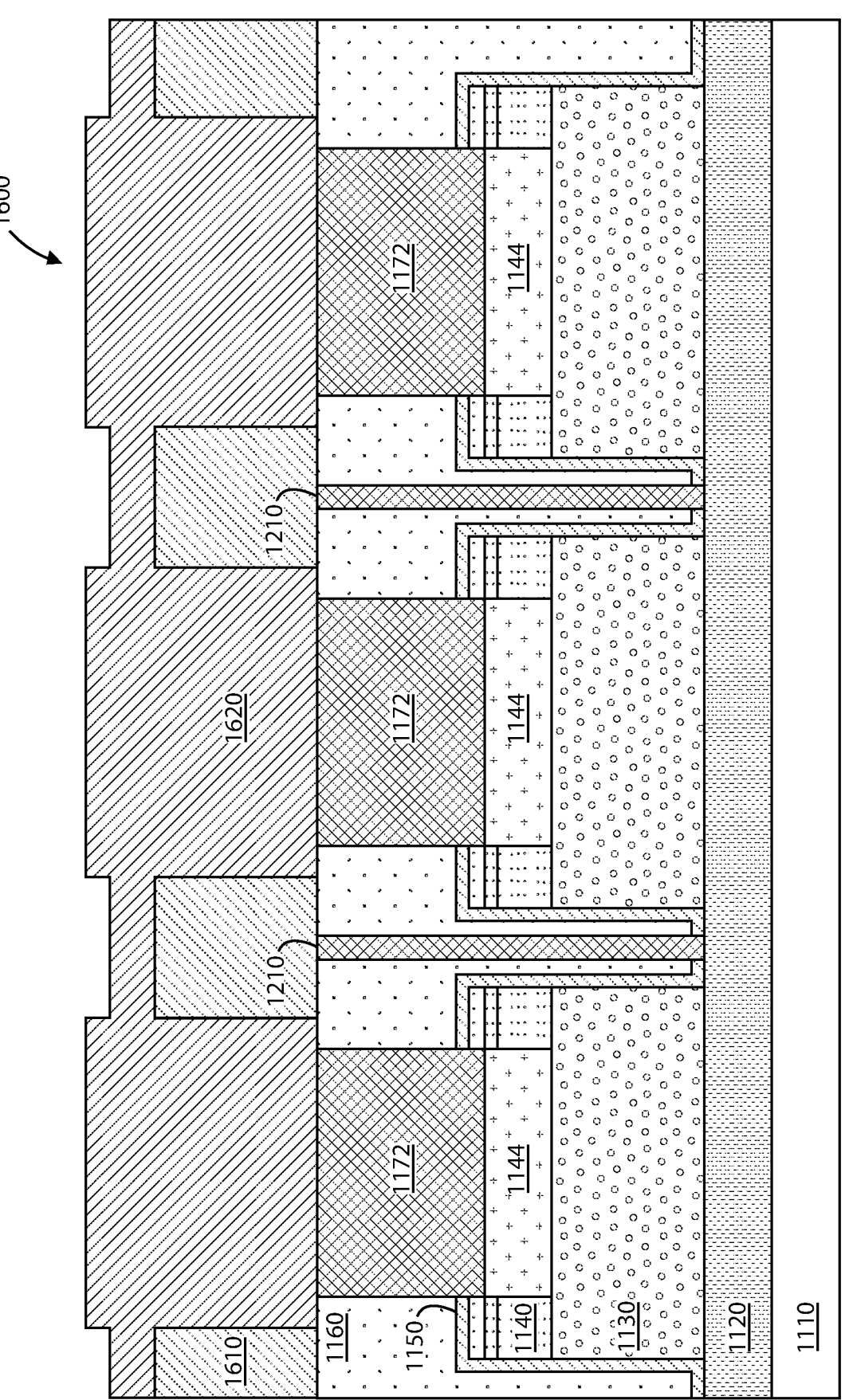
Figure 16D:
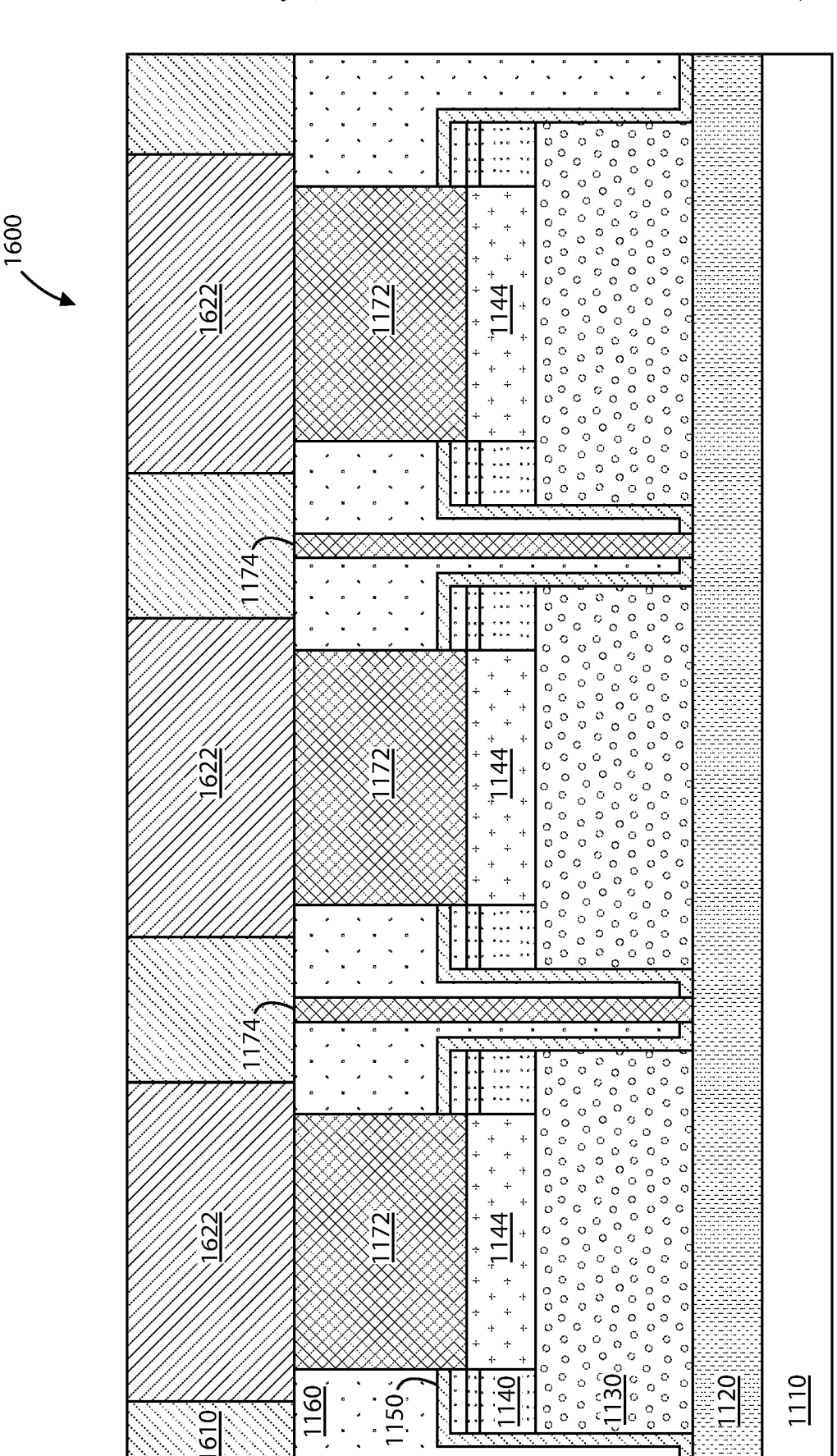

FIG. 16C shows a method step of forming a metal interconnect layer 1620 overlying the passivation layer 1610 and each of the interconnect footprint cavities 1612. As discussed previously, the metal interconnect layer 1620 can include aluminum, copper, or other similar metal materials. Then, FIG. 16D shows a method step of planarizing the metal interconnect layer 1620 to form a metal interconnect material 1622 within each cavity 1612. As discussed previously, the planarizing process can include polishing, etching, or other removal processes. These metal interconnect materials 1622 are spatially configured overlying at least each of the metal contact materials 1172, and may extend to one or more portions of the dielectric material 1160 depending on the desired size determined by the footprint cavity 1612.

Although the methods shown in FIGS. 15A to 15C and FIGS. 16A to 16D are applied to a sensor device similar to device 1202 of FIG. 12B, these methods can be applied to other variations and examples, such as device 1201 of FIG. 12A without the metal isolation structures, or any other devices discussed herein. The formation of the passivation materials, metal materials, and other device materials can include a physical vapor deposition (PVD) process, a chemical vapor deposition (CVD), or other similar deposition process. And, the removal of such materials can include wet etching, dry etching, grinding, polishing, or other removal processes.

Figures 17A, 17B, 17C:
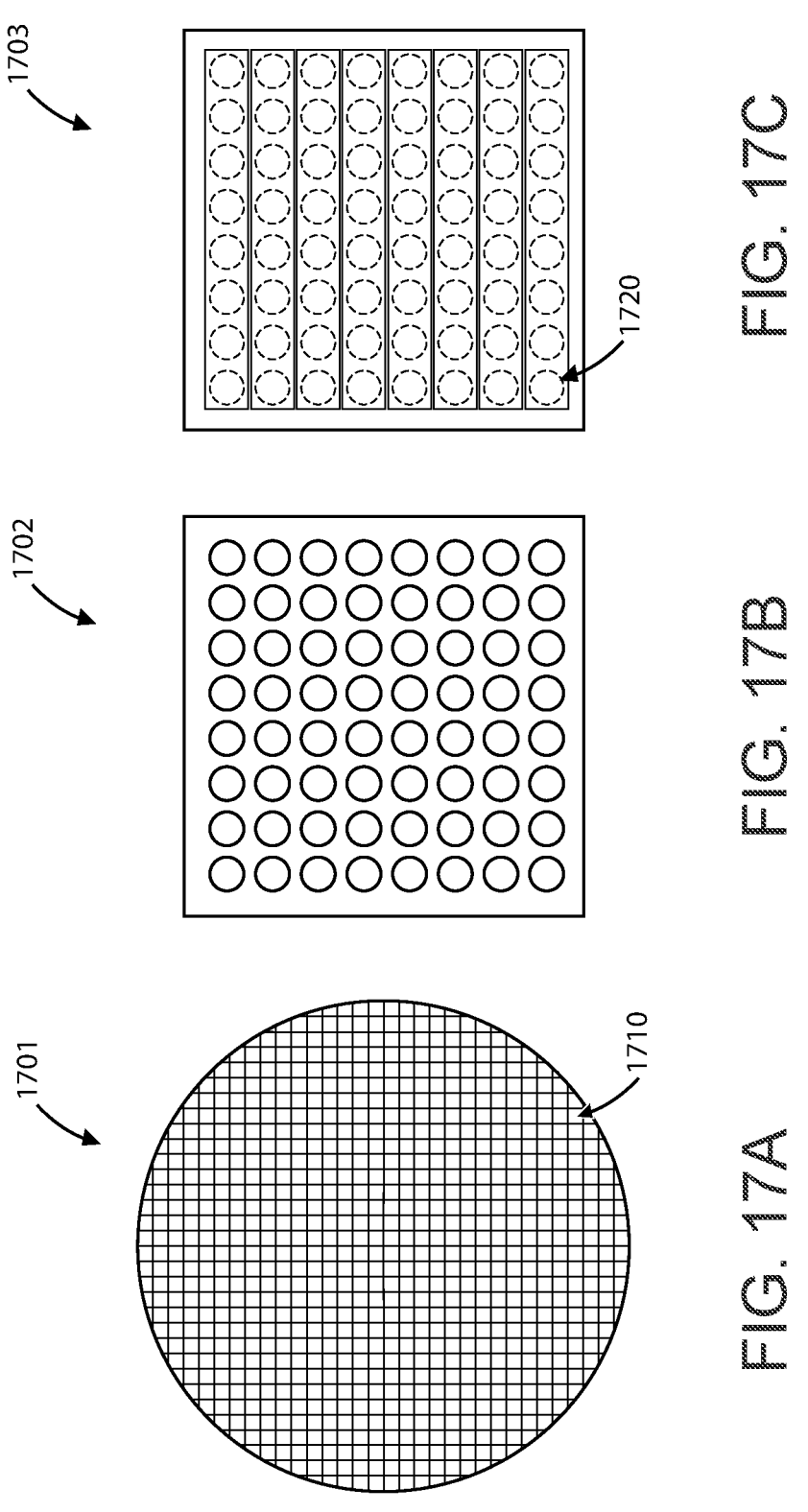
FIGS. 17A to 17C are simplified diagrams illustrating wafer die patterns according to various examples of the present invention.

FIGS. 17A to 17C are simplified diagrams illustrating wafer die patterns according to various examples of the present invention. FIG. 17A illustrates a wafer 1701 with an example die pattern, where each individual die (e.g., die 1710) may vary in size/area from small, such as less than 1 mm×1 mm, to a larger size that is the maximum allowable for the lithography system used. Within each die, various patterns of the dielectric can be leveraged should selective area heteroepitaxy be utilized for CS material growth on Si. Examples can include circular patterns (shown in die 1702 of FIG. 17B), rectangular patterns (shown in die 1703 of FIG. 17C). Pattern shape and size selection can assist, along with growth optimization and pattern fill factor, to achieve higher material quality. For the rectangular stripe patterns shown in die 1703, circular photodetectors, denoted by the dashed circles (e.g., photodetector 1720), could be formed following growth by mesa etching or by diffusion, the latter of which would form a planar device. The patterns represent the area from which the dielectric, for selective area heteroepitaxy, is removed to expose the Si surface below the dielectric.

Other patterns, such as, but not limited to, squares, ovals, trapezoids, different size rectangles, parallelograms, and various polygons could be leveraged without departing from the scope of the invention. The sequence of steps to complete the realization of such photodetectors and photodetector arrays can be carried out in a number of ways and in different order, and the design of the device layers and structure could be varied, without departing from the scope of the invention.

Figure 18:
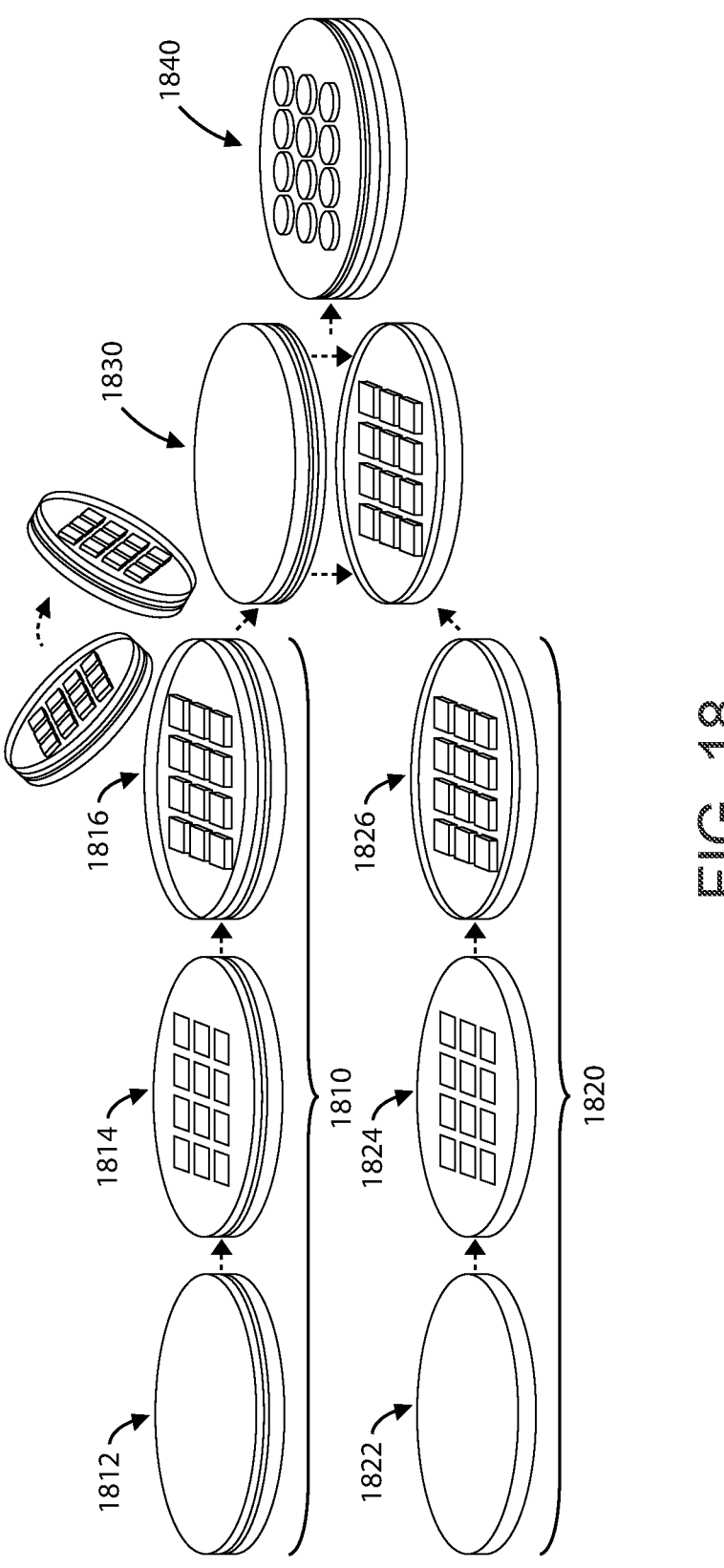
FIG. 18 is a simplified flow diagram illustrating a method to manufacture photodetectors and photodetector array circuits according to an example of the present invention.

FIG. 18 is a simplified flow diagram illustrating a method to manufacture photodetectors and photodetector array circuits according to an example of the present invention. As shown, FIG. 18 illustrates and summarizes sequences of parallel steps that could be carried out to realize CS on Si photodetectors and photodetector arrays that are then integrated with CMOS circuits capable of functions including, but not limited to, read out, logic, AI, machine learning (ML), signal processing, and image processing. In an example, the present method includes a front-end photodetector fabrication process 1810 and a front-end CMOS IC fabrication process 1820 performed in parallel.

As shown, the front-end photodetector fabrication process 1810 can include providing a substrate 1812 (e.g., Si substrate, SOI substrate, or the like), performing CS on Si heteroepitaxy and forming device structures to produce device 1814, and performing metallization to produce device 1816. The CS on Si heteroepitaxy, device structure formation, and metallization steps can be carried out to realize structures such as, but not limited to, those described in the embodiments shown previously. Or, the substrate 1812 can be a holding wafer in which known good die having such realized device structures may be picked, placed, and bonded on the holding wafer.

For the front-end IC fabrication process 1820, the steps can similarly include providing a substrate 1822 (e.g., Si CMOS substrate, or the like), performing IC fabrication processes (e.g., ROIC on Si process and/or other IC front-end fabrication) to produce device 1824, and performing metallization to produce device 1826.

Following front-end fabrication of the photodetector circuits (process 1810) and the CMOS circuits (process 1820), the wafers (devices 1816 and 1826) could be bonded face-to-face (e.g., a flip-chip bonding process, die-to-wafer process, or the like), as shown by device 1830, leveraging common bonding techniques such as, but not limited to, oxide-to-oxide and copper-to-copper (Cu-to-Cu) bonding. The precise steps for back-end fabrication, including bonding integration, could vary depending on the photodetector structure and photodetector front-end fabrication sequence, and the CMOS device structure and CMOS front-end fabrication sequence, without departing from the scope of the invention.

Following the bonding, back-end fabrications steps may be performed to produce a processed device 1840. Such back-end fabrication steps may include, but are not limited to: removal of the photodetector handle wafer, either partially or entirely by grinding, etching, or polishing, or a combination therein; application of backside contacts, which could be made to either the n-side or p-side of the photodetector, depending on the orientation of the photodetector structure (i.e., whether the photodetector is a PIN or PN structure from the top down, or NIP or NP structure from the top down; application of color filters; application of lenses or other optics). The device structure could be front side illuminated (FSI) or back side illuminated (BSI) and the precise steps and the order of the steps could vary without departing from the scope of the invention.

Alternatively to the wafer-to-wafer process described, the fabrication of photodetectors bonded to CMOS circuits could also be carried out in a chip-to-wafer or chip-to-chip fashion. Those of ordinary skill in the art will recognize other variations, modifications, and alternatives.

FIGS. 19A to 19D are simplified diagrams illustrating a method for forming sensor isolation structures in a sensor array device according to an example of the present invention. Here, the method includes coupling a sensor device to an integrated circuit (IC) device and forming sensor isolation structures within the sensor device in a backend fabrication process. In these figures, shared reference numerals in subsequent figures refer to the same elements as described in previous figures. Further, with regard to the device discussed below, materials and components discussed for other examples of the present invention may be included here as well.

Figure 19A:
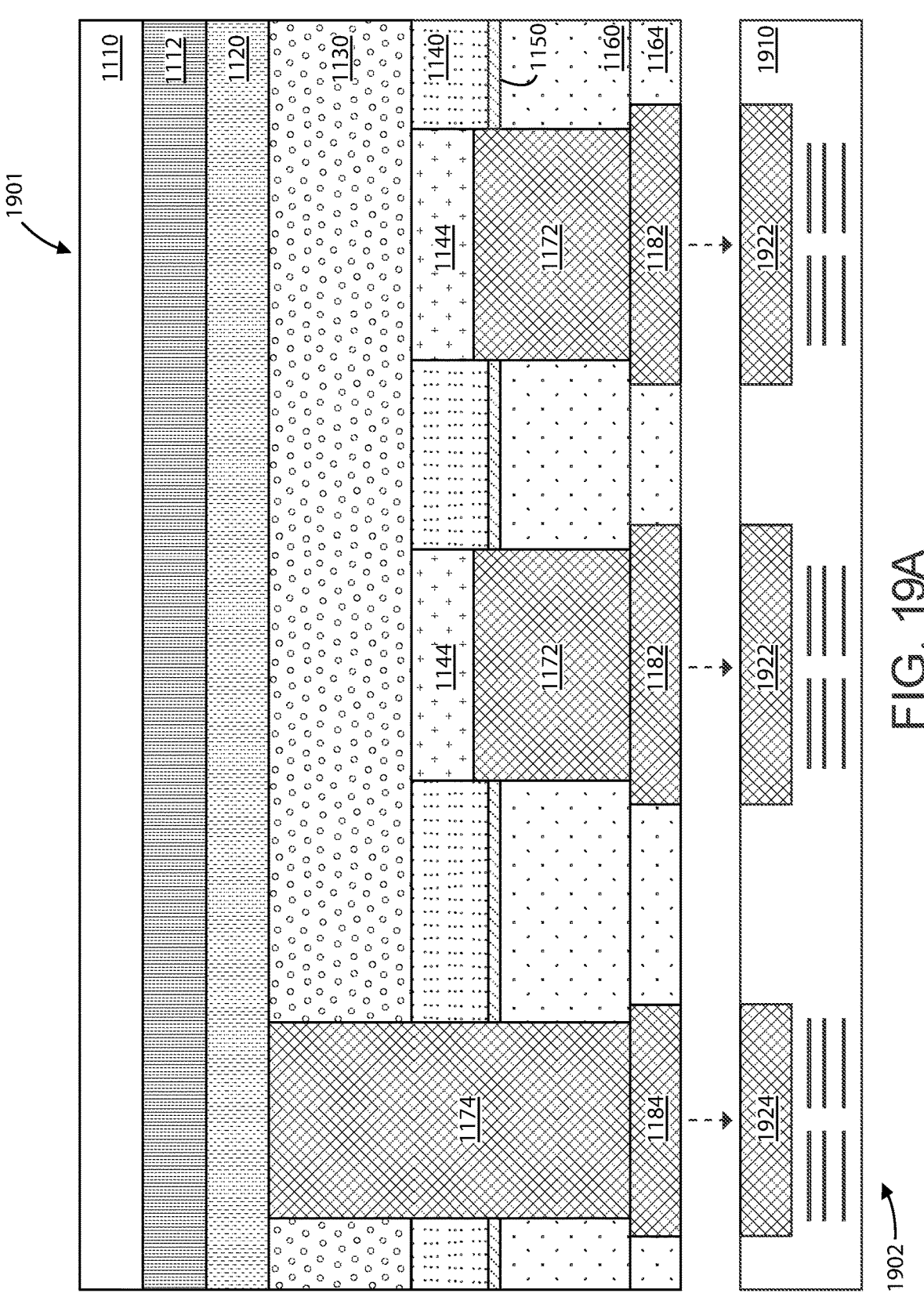
FIGS. 19A to 19D are simplified diagrams illustrating a method for forming sensor isolation structures in a sensor array device according to an example of the present invention.

FIG. 19A shows a method step of flipping a sensor array device 1901 (similar to device 1100 of FIGS. 11A to 11J) and coupling this sensor array device 1901 to an IC device 1902 resulting in an integrated sensor device 1900. The IC device 1902 includes bond pads 1922, 1924 configured overlying a device region 1910. Also, compared to device 1100, this sensor array device 1901 also includes a buffer material 1112 configured between the silicon substrate 1110 and the n-type material 1120. These devices can be coupled such that the bond pads of the sensor array device 1901 are bonded to the bond pads of the IC device 1902. As shown, the p-type bond pads 1182 and n-type bond pad 1924 are coupled to the first bond pads 1922 the second bond pad 1924 of the IC device 1902, respectively. In an example, the IC device 1902 can include a logic IC device, a readout IC (ROIC) device, or the like. Further, these devices can be coupled using a die-to-wafer (D2 W) bonding process (as shown in FIG. 19A), a solder bump bonding process, or the like.

Figure 19B:
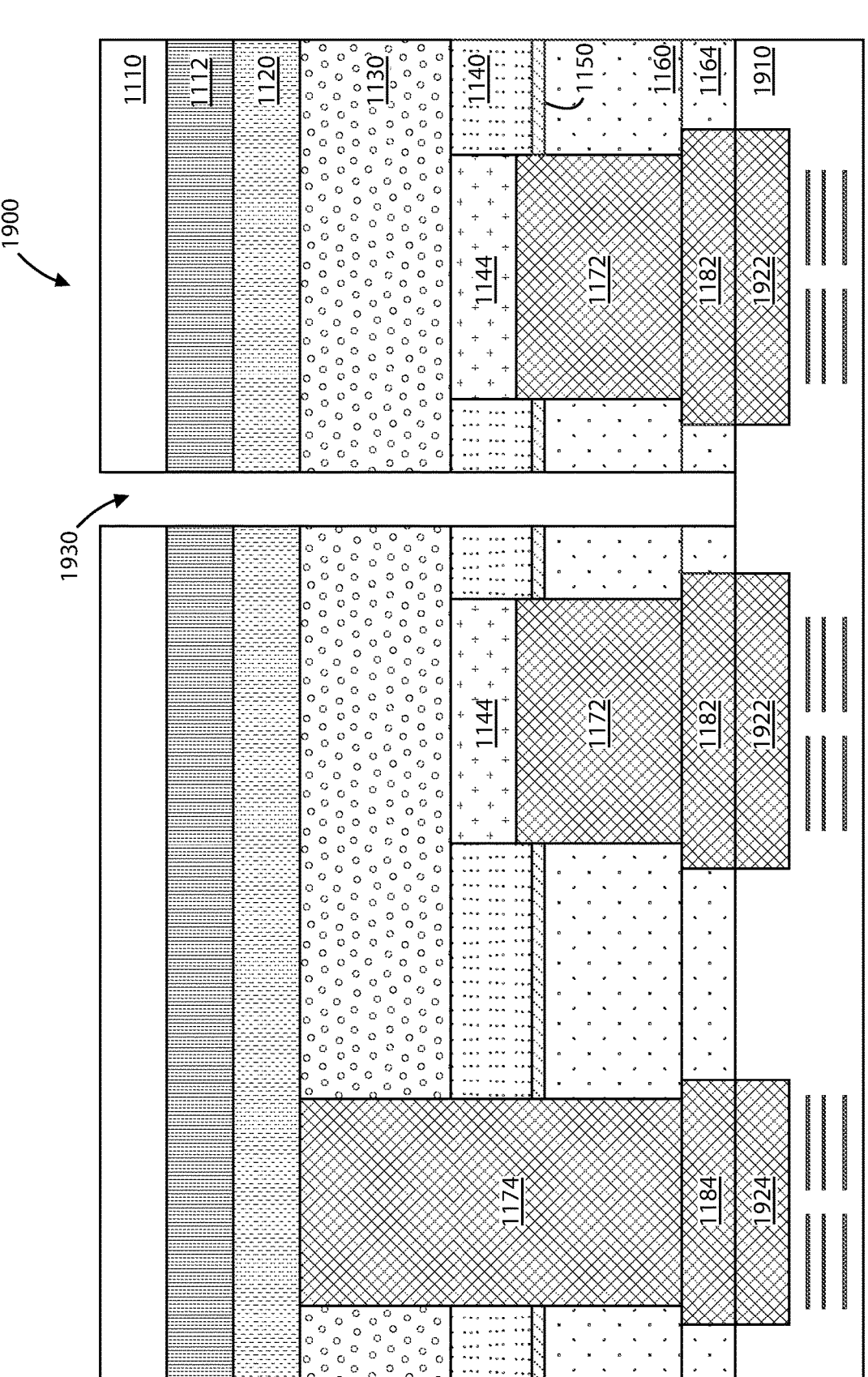
Figure 19C:
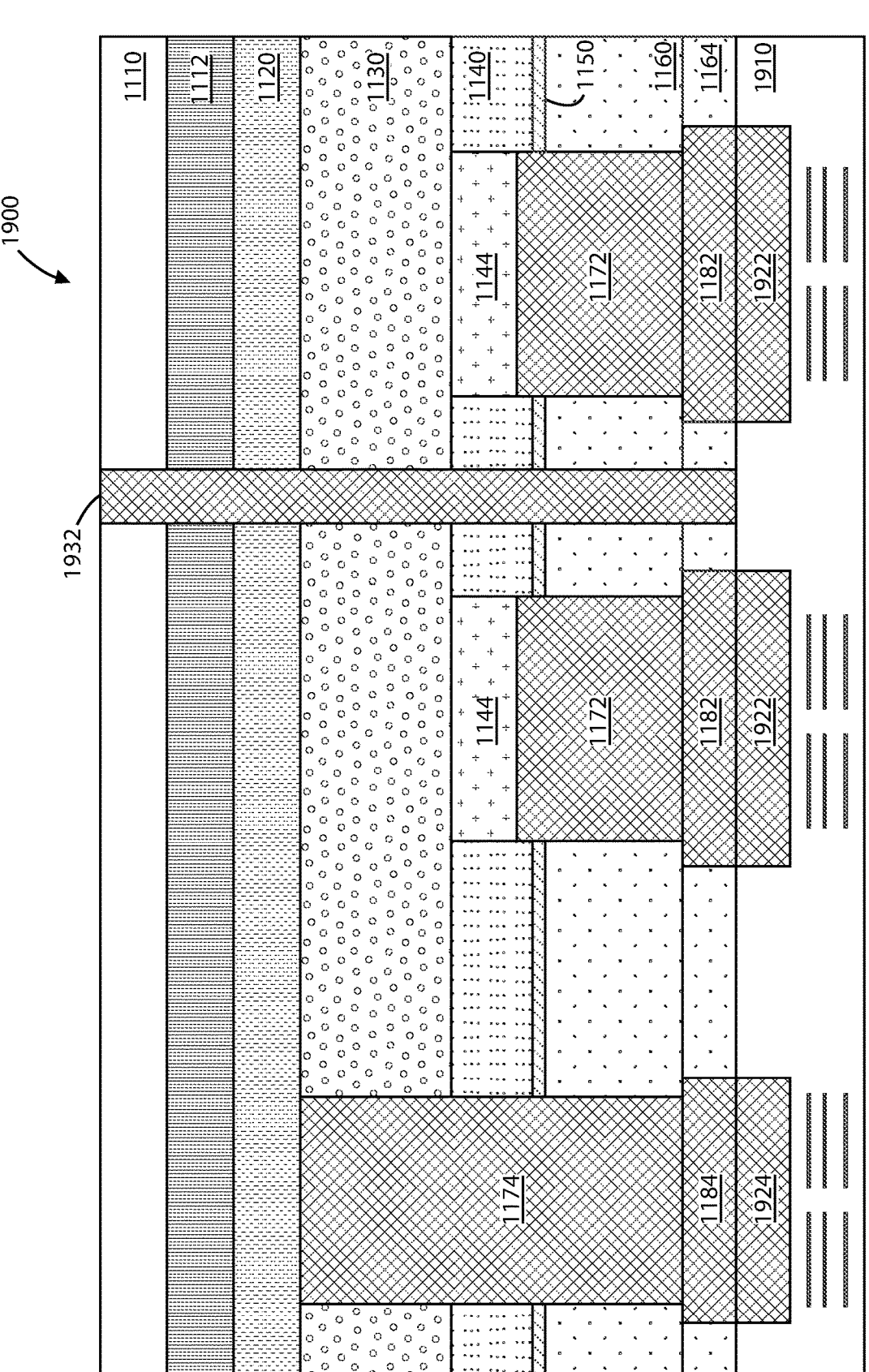

FIG. 19B shows a method step of removing one or more portions of forming one or more backside isolation trench regions 1930 between the device regions of the sensor device (previously shown as device 1901) to the device region 1910 of the IC device (previously shown as device 1902). Similar to the previous trench regions, these trench regions 1930 can be formed as using etching processes, via formation process, and the like. FIG. 19C shows a method step of forming a metal fill material 1932 within the one or more backside isolation trench regions 1930 to form backside isolation structures.

In an example, embodiments of the present sensor array device may also separate the device regions by the back-side isolation trenches 1930 without the metal fill material 1932, similar to the isolation configuration shown in FIG. 12A. Depending on the application, such back-side isolation configurations may be preferred to the front-side isolation configurations (see FIGS. 12A and 12B).

Figure 19D:
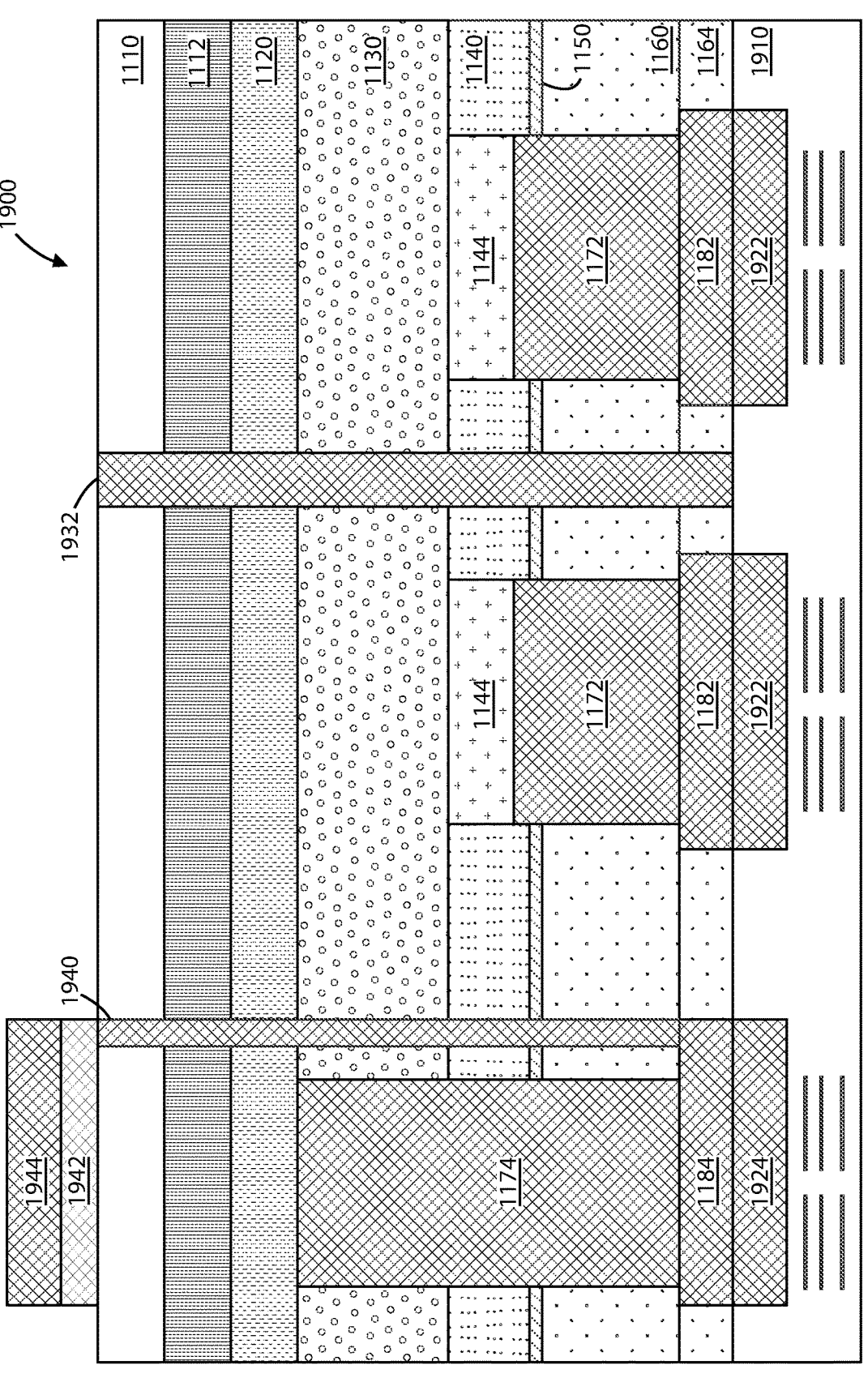

FIG. 19D shows a method of step of forming a backside metal contact structure (e.g., TSV process, or the like). Similarly, this process can include removing one or more portions of the sensor array device materials (e.g., silicon substrate 1110, buffer material 1112, n-type material 1120, transition material 1130, transparent material 1140, and dielectric materials 1150, 1160, and 1164) to form a backside contact trench region overlying the second bond pad 1184. A metal fill material 1940 can be formed within the backside contact trench region, and a metal contact material 1942 and/or a bond pad 1944 can be formed overlying a portion of the silicon substrate 1110 coupled to the metal fill material 1940. Of course, there can be other variations, modifications, and alternatives.

Figure 20A:
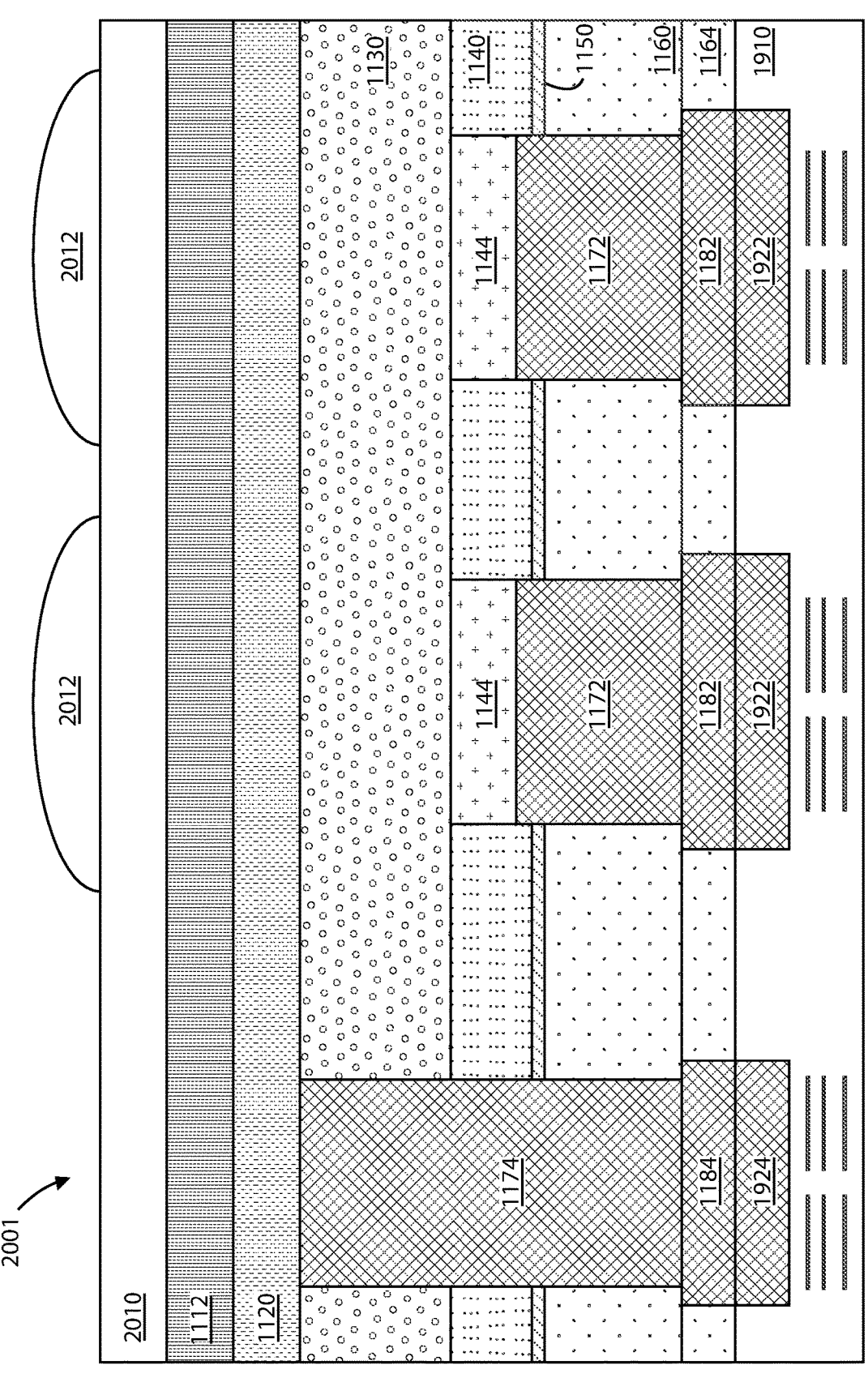
FIG. 20A is a simplified diagram illustrating a sensor device with a surface relief structure according to an example of the present invention.

FIG. 20A is a simplified diagram illustrating a sensor device with a surface relief structure according to an example of the present invention. In these figures, shared reference numerals in subsequent figures refer to the same elements as described in previous figures. Further, with regard to the device discussed below, materials and components discussed for other examples of the present invention may be included here as well.

As shown, device 2001 is similar to device 1900 of FIG. 19B. Here, device 2001 includes one or more surface relief structures 2012 formed overlying a substrate 2010, which can include a silicon material, a glass material, or the like. The surface relief structures 2012 can include a microlens array, an optical diffuser, a diffraction grating, or other micro or nano structures, and the like. In an example, these surface relief structures 2012 can be formed by patterning one or more surface relief materials on the surface of the substrate 2010 (or the substrate 1110) and using a reflow process to shape the surface relief material to a desired shape. Then, the surface relief materials can form the surface relief structures 2012 following an etching process that also thins the substrate 2010. Or, the surface relief materials (pre or post etching) can be used to form a mold (e.g., UV mold using polymer resin) which is used to form the surface relief structures on the substrate 2010. The substrate 2010 can then be bonded to the integrated sensor device 1900. There can be variations, modifications, and alternatives to these surface relief forming processes as well.

Figure 20B:
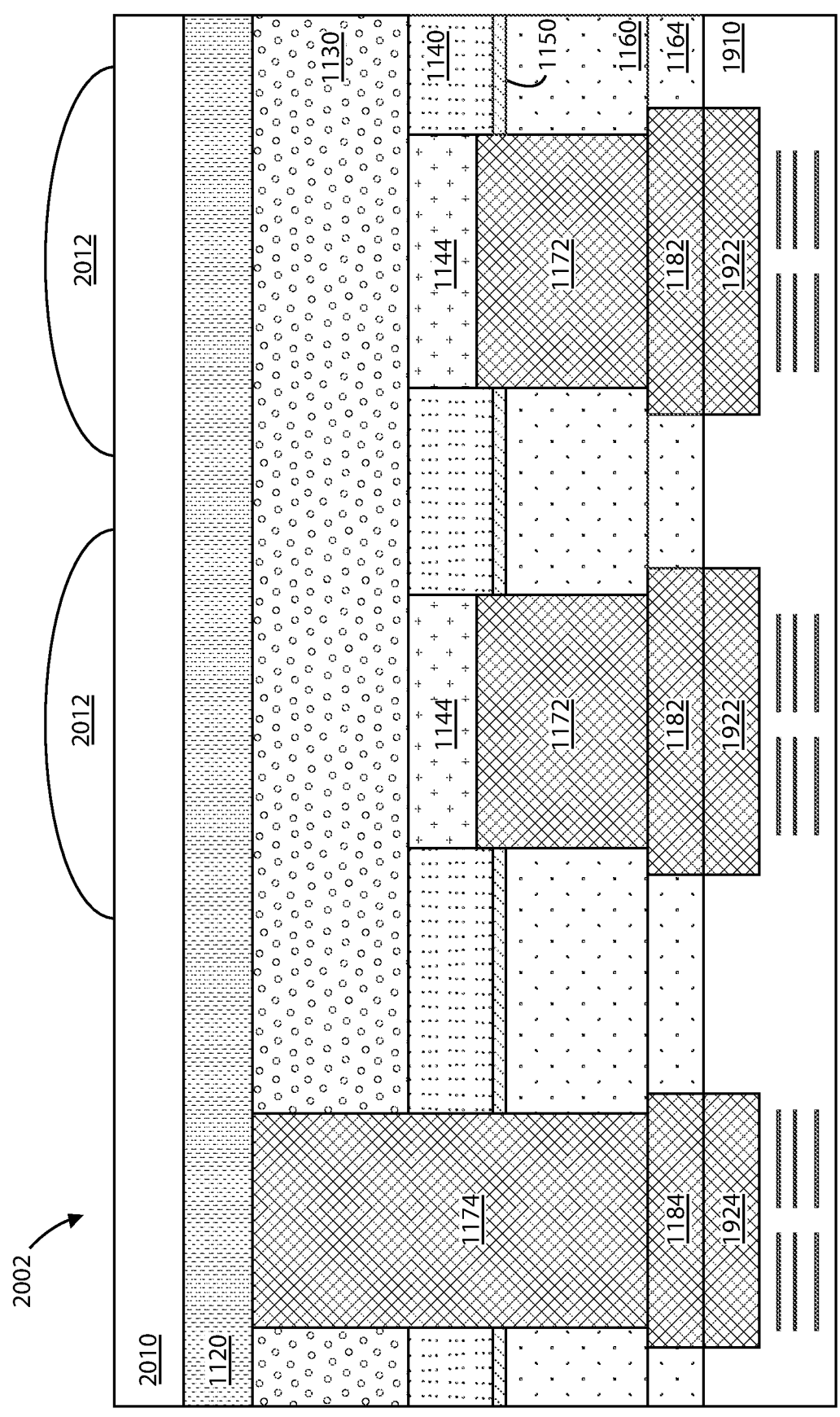
FIG. 20B is a simplified diagram illustrating a sensor device with a surface relief structure according to an example of the present invention.

FIG. 20B is a simplified diagram illustrating a sensor device with a surface relief structure according to an example of the present invention. In these figures, shared reference numerals in subsequent figures refer to the same elements as described in previous figures. Further, with regard to the device discussed below, materials and components discussed for other examples of the present invention may be included here as well. Compared to device 2001, this device 2002 removes the substrate 1110 and the buffer material 1112 prior to bonding the substrate 2010 with the surface relief structures 2012 to the n-type semiconductor material 1120. Depending on the application, this technique can improve efficiency performance. Those of ordinary skill in the art will recognize other variations, modifications, and alternatives.

Figure 21A:
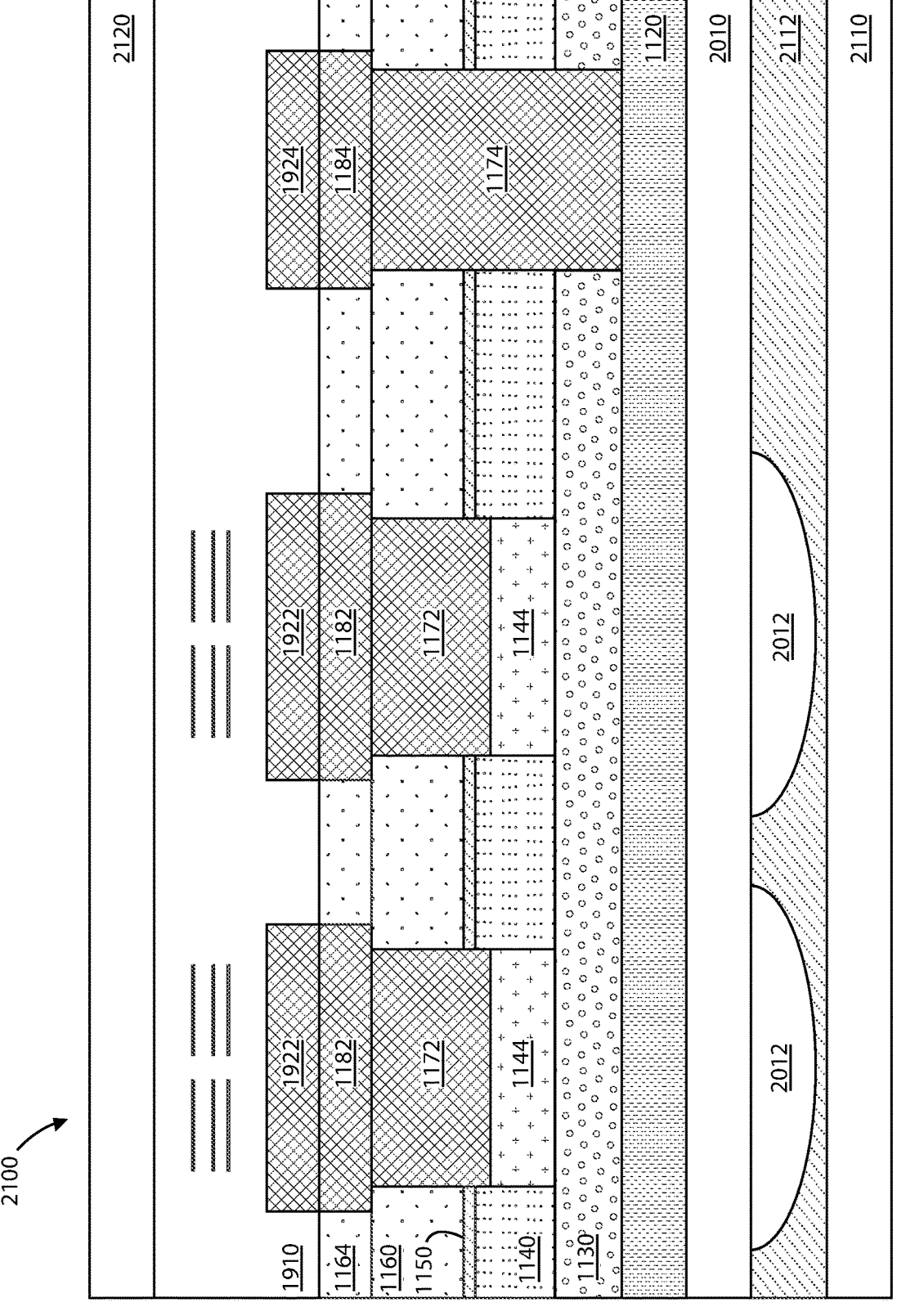
FIGS. 21A to 21C are simplified diagrams illustrating a method for forming a backside contact structure in a sensor array device according to an example of the present invention.
Figure 21B:
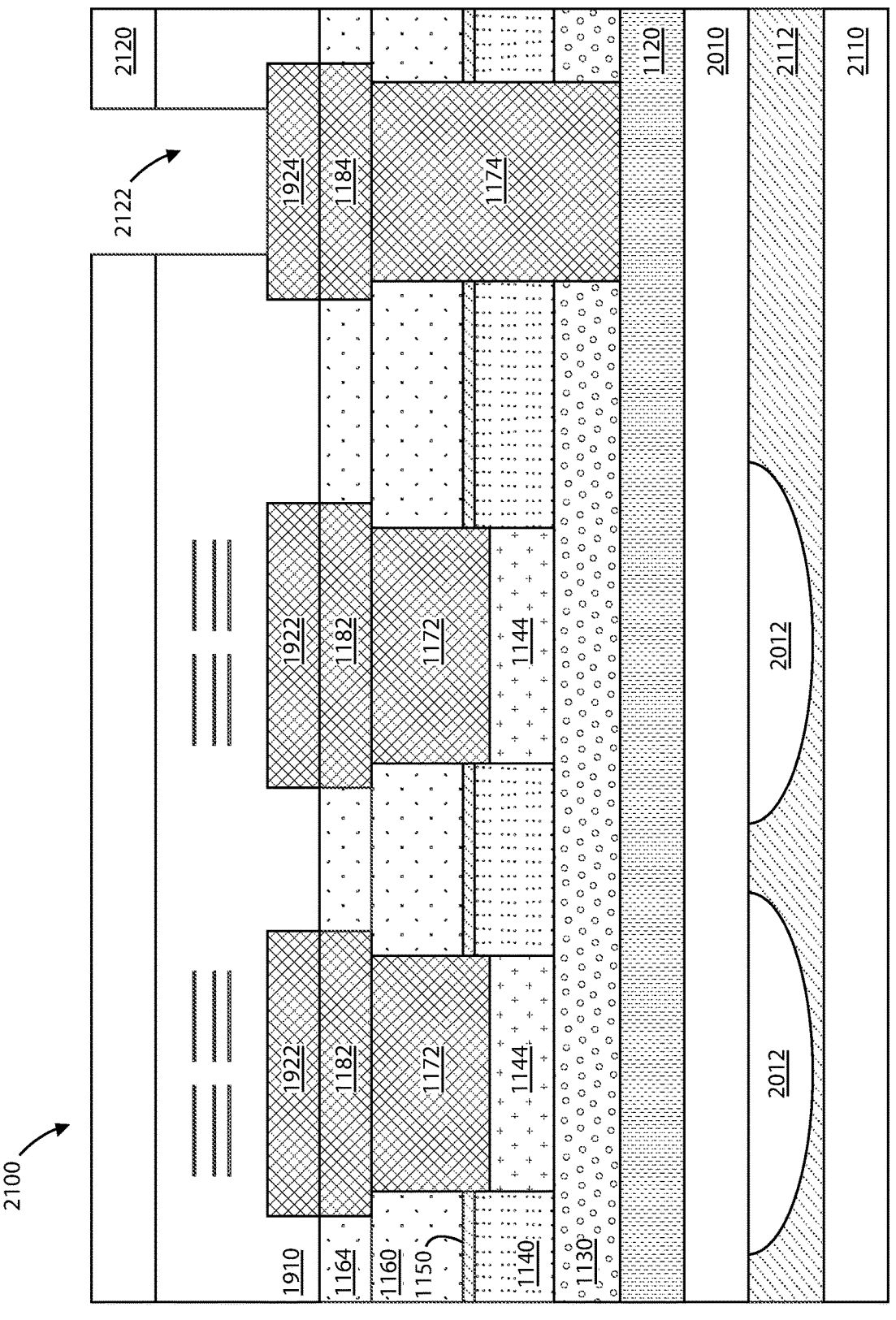
Figure 21C:
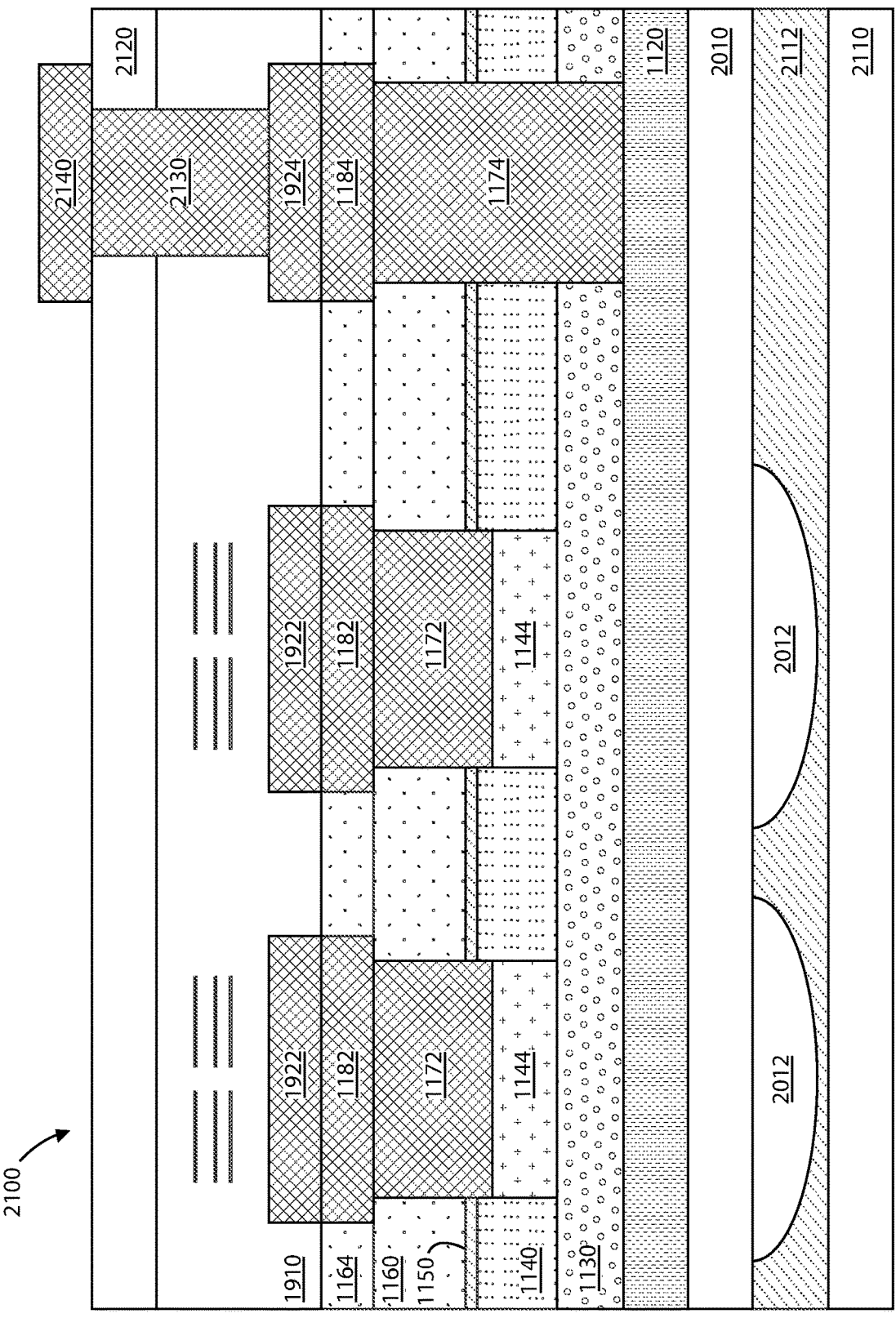

FIGS. 21A to 21C are simplified diagrams illustrating a method for forming a backside contact structure in a sensor array device according to an example of the present invention. Here, the method includes forming a contact structure through the IC device portion of the integrated sensor device. In these figures, shared reference numerals in subsequent figures refer to the same elements as described in previous figures. Further, with regard to the device discussed below, materials and components discussed for other examples of the present invention may be included here as well.

FIG. 21A shows an integrated device 2100 similar device 1900 of FIG. 19B oriented with the IC device portion (shown previously as IC device 1902) facing upwards. Here, this IC device portion also shows the substrate 2100 (e.g., silicon substrate, or the like) that the IC device portion was formed on prior to bonding to the sensor array device portion (shown previously as sensor array device 1901).

FIG. 21B shows a method step of removing one or more portions of the substrate 2100 and the IC device region 1910 overlying the second bond pad 1924 of the IC device portion to form a contact trench region 2122. Then, FIG. 21C shows a method step of forming a metal fill material 2130 within the contact trench region 2122 and a bond pad 2140 overlying the metal fill material 2130 to form a contact structure. This method can include similar materials and configurations as discussed for previous contact structure formation processes.

Using the previous discussed methods of planarization and front-end and back-end contact structure formation, embodiments of the present invention can include 3D stacked configurations. For example, the stacked configuration can include, an optics layer (e.g., microlens array) overlying a sensor array device layer, which is configured overlying IC device layer, as shown in FIGS. 20A and 20B. These layers can be further configured on additional device layers, memory layers, or the like. Further, these methods can also be used to wafer-scale (die) tiling to build large format arrays (e.g., using a single 12-inch wafer stack/pair). Those of ordinary skill in the art will recognize other variations, modifications, and alternatives.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A method for fabricating an integrated sensor array device, the method comprising:

providing a partially completed semiconductor substrate comprising a silicon substrate, a buffer material overlying the silicon substrate, an n-type semiconductor material overlying the silicon substrate, a transition material overlying the n-type semiconductor material, and an unintentionally doped (UID) optically transparent semiconductor material overlying the transition material;

forming a first dielectric material overlying at least a portion of the UID optically transparent semiconductor material;

removing one or more portions of the UID optically transparent material and the transition material to form one or more isolation trench regions and a recessed region, the one or more isolation trench regions separating a plurality of device regions;

forming a first dielectric material overlying the UID optically transparent material, the transition material, and the one or more isolation trench regions;

removing a portion of the first dielectric material within the recessed region to form an n-type contact region;

forming a second dielectric material overlying the first dielectric material, the one or more isolation trench regions, the recessed region, and the n-type contact region;

removing a portion of the second dielectric material and the first dielectric material overlying the UID optically transparent semiconductor material within each device region to form a first contact trench region exposing a portion of the UID optically transparent semiconductor material of each device region;

forming a p-type contact region within a portion of the UID optically transparent semiconductor material of each device region;

forming a first metal contact material within the first contact trench region overlying the p-type contact region of each device region;

removing a portion of the second dielectric material and the first dielectric material overlying the n-type contact region to form a second contact trench region;

forming a second metal contact material overlying the n-type contact region within the second contact trench region;

forming a third dielectric material overlying the second dielectric material, the first metal contact materials, and the second metal contact material;

removing a plurality of first portions of the third dielectric material to define a first bond pad region overlying the first metal contact material of each device region;

removing a second portion of the third dielectric material to define a second bond pad region overlying the second metal contact material;

forming a first bond pad within the first bond pad region overlying the first metal contact material of each device region; and forming a second bond pad within the second bond pad region overlying the second metal contact material forming a first metal interconnect material overlying each first bond pad;

forming a passivation material overlying the first metal interconnect materials, the first bond pads, and the third dielectric material;

removing one or more portions of the passivation material using a planarization process to smooth the passivation material and expose the first metal interconnect materials, resulting in a planarized sensor array device; and bonding the planarized sensor array device overlying an integrated circuit (IC) device such that the first metal interconnect materials are coupled to a plurality of first IC bond pads of the IC device and the second metal interconnect material is coupled to a second IC bond pad of the IC device.

2. The method of claim 1 wherein forming the one or more isolation trench regions and the recessed region comprises:

removing one or more portions of UID optically transparent material using an inductively coupled plasma (ICP) etching process to form the one or more isolation trench regions and the recessed region;

removing one or more portions of the UID optically transparent material underlying the one or more isolation trench regions and the recessed region using a spacer patterning process to extend the one or more isolation trench regions and the recessed region such that the underlying transition material is exposed; and removing one or more portions of the transition material underlying the one or more isolation trench regions and the recessed region using a mask process.

3. The method of claim 1 further comprising removing a portion of the second dielectric material and the first dielectric material overlying each of the one or more isolation trench regions to form a metal isolation trench region; and forming a metal fill material within each metal isolation trench region.

4. The method of claim 1 further comprising forming a plurality of surface relief structures overlying a backside surface region of the silicon substrate, wherein the surface relief structures includes microlenses, optical diffusers, or diffraction gratings.

5. The method of claim 1 further comprising removing the silicon substrate using a grinding, polishing, or etching process;

removing the buffer material using a grinding, polishing, or etching process;

forming a plurality of surface relief structures overlying a frontside surface region of an optics silicon substrate, wherein the surface relief structures includes microlenses, optical diffusers, or diffraction gratings; and bonding a backside surface region of the optics silicon substrate to the n-type semiconductor material.

6. The method of claim 1 further comprising removing one or more portions of the bonded planarized sensor array device overlying the second metal interconnect to form a backside contact trench region;

forming a backside metal fill material within the backside contact trench region; and forming a backside bond pad overlying the backside contact trench region and a portion of the silicon substrate, the backside bond pad being coupled to the second metal interconnect through the backside metal fill material.

7. The method of claim 1 wherein the bonded IC device is spatially oriented overlying the bonded planarized sensor array device; and further comprising removing one or more portions of the bonded IC device from overlying the second IC bond pad to form a backside contact trench region;

forming a backside metal fill material within the backside contact trench region; and forming a backside bond pad overlying the backside contact trench region and a portion of an IC silicon substrate of the bonded IC device, the backside bond pad being coupled to the second IC bond pad through the backside metal fill material.

8. The method of claim 1 wherein the bonded IC device is spatially oriented overlying the bonded planarized sensor array device; and further comprising removing one or more portions of the bonded IC device from overlying the second IC bond pad to form a backside contact trench region;

forming a backside metal fill material within the backside contact trench region; and forming a backside bond pad overlying the backside contact trench region and a portion of an IC silicon substrate of the bonded IC device, the backside bond pad being coupled to the second IC bond pad through the backside metal fill material.

9. A method for fabricating an integrated sensor array device, the method comprising:

providing a partially completed semiconductor substrate comprising a silicon substrate, a buffer material overlying the silicon substrate, an n-type semiconductor material overlying the silicon substrate, a transition material overlying the n-type semiconductor material, and an unintentionally doped (UID) optically transparent semiconductor material overlying the transition material;

forming a first dielectric material overlying at least a portion of the UID optically transparent semiconductor material;

removing one or more portions of the UID optically transparent material and the transition material to form one or more isolation trench regions and a recessed region, the one or more isolation trench regions separating a plurality of device regions;

forming a first dielectric material overlying the UID optically transparent material, the transition material, and the one or more isolation trench regions;

removing a portion of the first dielectric material within the recessed region to form an n-type contact region;

forming a second dielectric material overlying the first dielectric material, the one or more isolation trench regions, the recessed region, and the n-type contact region;

removing a portion of the second dielectric material and the first dielectric material overlying the UID optically transparent semiconductor material within each device region to form a first contact trench region exposing a portion of the UID optically transparent semiconductor material of each device region;

forming a p-type contact region within a portion of the UID optically transparent semiconductor material of each device region;

forming a first metal contact material within the first contact trench region overlying the p-type contact region of each device region;

removing a portion of the second dielectric material and the first dielectric material overlying the n-type contact region to form a second contact trench region;

forming a second metal contact material overlying the n-type contact region within the second contact trench region;

forming a passivation layer overlying the second dielectric material and the first metal contact material of each device region;

removing a portion of the passivation layer overlying the first metal contact material of each device region to form an interconnect footprint cavity overlying the first metal contact material of each device region;

forming a metal interconnect layer overlying the passivation layer and within the interconnect footprint cavity of each device region; and removing one or more portions of the metal interconnect layer using a planarization process to form a metal interconnect material within the interconnect footprint cavity of each device region, resulting in a planarized sensor array device; and bonding the planarized sensor array device overlying an integrated circuit (IC) device such that the first metal interconnect materials are coupled to a plurality of IC bond pads of the IC device.

10. The method of claim 9 wherein forming the one or more isolation trench regions and the recessed region comprises:

removing one or more portions of UID optically transparent material using an inductively coupled plasma (ICP) etching process to form the one or more isolation trench regions and the recessed region;

removing one or more portions of the UID optically transparent material underlying the one or more isolation trench regions and the recessed region using a spacer patterning process to extend the one or more isolation trench regions and the recessed region such that the underlying transition material is exposed; and removing one or more portions of the transition material underlying the one or more isolation trench regions and the recessed region using a mask process.

11. The method of claim 9 further comprising removing a portion of the second dielectric material and the first dielectric material overlying each of the one or more isolation trench regions to form a metal isolation trench region; and forming a metal fill material within each metal isolation trench region.

12. The method of claim 9 further comprising forming a plurality of surface relief structures overlying a backside surface region of the silicon substrate, wherein the surface relief structures includes microlenses, optical diffusers, or diffraction gratings.

13. The method of claim 9 further comprising removing the silicon substrate using a grinding, polishing, or etching process;

removing the buffer material using a grinding, polishing, or etching process;

forming a plurality of surface relief structures overlying a frontside surface region of an optics silicon substrate, wherein the surface relief structures includes microlenses, optical diffusers, or diffraction gratings; and bonding a backside surface region of the optics silicon substrate to the n-type semiconductor material.

14. The method of claim 9 further comprising removing one or more portions of the bonded planarized sensor array device overlying the second metal interconnect to form a backside contact trench region;

forming a backside metal fill material within the backside contact trench region; and forming a backside bond pad overlying the backside contact trench region and a portion of the silicon substrate, the backside bond pad being coupled to the second metal interconnect through the backside metal fill material.

15. A method for fabricating an integrated sensor array device, the method comprising:

providing a partially completed semiconductor substrate comprising a silicon substrate, a buffer material overlying the silicon substrate, an n-type semiconductor material overlying the silicon substrate, a transition material overlying the n-type semiconductor material, and an unintentionally doped (UID) optically transparent semiconductor material overlying the transition material;

forming a first dielectric material overlying at least a portion of the UID optically transparent semiconductor material;

removing one or more portions of the UID optically transparent material and the transition material to form a recessed region;

forming a first dielectric material overlying the UID optically transparent material and the transition material;

removing a portion of the first dielectric material within the recessed region to form an n-type contact region;

forming a second dielectric material overlying the first dielectric material, the recessed region, and the n-type contact region;

removing a plurality of portions of the second dielectric material and the first dielectric material overlying the UID optically transparent semiconductor material to form a plurality of first contact trench regions, each first contact trench region exposing a portion of the UID optically transparent semiconductor material and defining a device region;

forming a p-type contact region within a portion of the UID optically transparent semiconductor material of each device region;

forming a first metal contact material within the first contact trench region overlying the p-type contact region of each device region;

removing a portion of the second dielectric material and the first dielectric material overlying the n-type contact region to form a second contact trench region;

forming a second metal contact material overlying the n-type contact region within the second contact trench region;

forming a third dielectric material overlying the second dielectric material, the first metal contact materials, and the second metal contact material;

removing a plurality of first portions of the third dielectric material to define a first bond pad region overlying the first metal contact material of each device region;

removing a second portion of the third dielectric material to define a second bond pad region overlying the second metal contact material;

forming a first bond pad within the first bond pad region overlying the first metal contact material of each device region; and forming a second bond pad within the second bond pad region overlying the second metal contact material forming a first metal interconnect material overlying each first bond pad;

forming a passivation material overlying the first metal interconnect materials, the first bond pads, and the third dielectric material;

removing one or more portions of the passivation material using a planarization process to smooth the passivation material and expose the first metal interconnect materials, resulting in a planarized sensor array device;

bonding the planarized sensor array device overlying an integrated circuit (IC) device such that the first metal interconnect materials are coupled to a plurality of first IC bond pads of the IC device and the second metal interconnect material is coupled to a second IC bond pad of the IC device;

removing a plurality of portions of the bonded planarized sensor array device overlying the bonded IC device to form a backside isolation trench region spatially configured between each device region; and forming a backside metal fill material within each backside isolation trench region.

16. The method of claim 15 further comprising forming a plurality of surface relief structures overlying a backside surface region of the silicon substrate, wherein the surface relief structures includes microlenses, optical diffusers, or diffraction gratings.

17. The method of claim 15 further comprising removing the silicon substrate using a grinding, polishing, or etching process;

removing the buffer material using a grinding, polishing, or etching process;

forming a plurality of surface relief structures overlying a frontside surface region of an optics silicon substrate, wherein the surface relief structures includes microlenses, optical diffusers, or diffraction gratings; and bonding a backside surface region of the optics silicon substrate to the n-type semiconductor material.

18. The method of claim 15 further comprising removing one or more portions of the bonded planarized sensor array device overlying the second metal interconnect to form a backside contact trench region;

forming a backside metal fill material within the backside contact trench region; and forming a backside bond pad overlying the backside contact trench region and a portion of the silicon substrate, the backside bond pad being coupled to the second metal interconnect through the backside metal fill material.

19. The method of claim 15 wherein the bonded IC device is spatially oriented overlying the bonded planarized sensor array device; and further comprising removing one or more portions of the bonded IC device from overlying the second IC bond pad to form a backside contact trench region;

forming a backside metal fill material within the backside contact trench region; and forming a backside bond pad overlying the backside contact trench region and a portion of an IC silicon substrate of the bonded IC device, the backside bond pad being coupled to the second IC bond pad through the backside metal fill material.

20. A method for fabricating an integrated sensor array device, the method comprising:

providing a partially completed semiconductor substrate comprising a silicon substrate, a buffer material overlying the silicon substrate, an n-type semiconductor material overlying the silicon substrate, a transition material overlying the n-type semiconductor material, and an unintentionally doped (UID) optically transparent semiconductor material overlying the transition material;

forming a first dielectric material overlying at least a portion of the UID optically transparent semiconductor material;

removing one or more portions of the UID optically transparent material and the transition material to form a recessed region;

forming a first dielectric material overlying the UID optically transparent material and the transition material;

removing a portion of the first dielectric material within the recessed region to form an n-type contact region;

forming a second dielectric material overlying the first dielectric material, the recessed region, and the n-type contact region;

removing a plurality of portions of the second dielectric material and the first dielectric material overlying the UID optically transparent semiconductor material to form a plurality of first contact trench regions, each first contact trench region exposing a portion of the UID optically transparent semiconductor material and defining a device region;

forming a p-type contact region within a portion of the UID optically transparent semiconductor material of each device region;

forming a first metal contact material within the first contact trench region overlying the p-type contact region of each device region;

removing a portion of the second dielectric material and the first dielectric material overlying the n-type contact region to form a second contact trench region;

forming a second metal contact material overlying the n-type contact region within the second contact trench region;

forming a passivation layer overlying the second dielectric material and the first metal contact material of each device region;

removing a portion of the passivation layer overlying the first metal contact material of each device region to form an interconnect footprint cavity overlying the first metal contact material of each device region;

forming a metal interconnect layer overlying the passivation layer and within the interconnect footprint cavity of each device region; and removing one or more portions of the metal interconnect layer using a planarization process to form a metal interconnect material within the interconnect footprint cavity of each device region, resulting in a planarized sensor array device;

bonding the planarized sensor array device overlying an integrated circuit (IC) device such that the first metal interconnect materials are coupled to a plurality of IC bond pads of the IC device;

removing a plurality of portions of the bonded planarized sensor array device overlying the bonded IC device to form a backside isolation trench region spatially configured between each device region; and forming a backside metal fill material within each backside isolation trench region.

21. The method of claim 20 further comprising forming a plurality of surface relief structures overlying a backside surface region of the silicon substrate, wherein the surface relief structures includes microlenses, optical diffusers, or diffraction gratings.

22. The method of claim 20 further comprising removing the silicon substrate using a grinding, polishing, or etching process;

removing the buffer material using a grinding, polishing, or etching process;

forming a plurality of surface relief structures overlying a frontside surface region of an optics silicon substrate, wherein the surface relief structures includes microlenses, optical diffusers, or diffraction gratings; and bonding a backside surface region of the optics silicon substrate to the n-type semiconductor material.

23. The method of claim 20 further comprising removing one or more portions of the bonded planarized sensor array device overlying the second metal interconnect to form a backside contact trench region;

forming a backside metal fill material within the backside contact trench region; and forming a backside bond pad overlying the backside contact trench region and a portion of the silicon substrate, the backside bond pad being coupled to the second metal interconnect through the backside metal fill material.

24. The method of claim 20 wherein the bonded IC device is spatially oriented overlying the bonded planarized sensor array device; and further comprising removing one or more portions of the bonded IC device from overlying the second IC bond pad to form a backside contact trench region;

forming a backside metal fill material within the backside contact trench region; and forming a backside bond pad overlying the backside contact trench region and a portion of an IC silicon substrate of the bonded IC device, the backside bond pad being coupled to the second IC bond pad through the backside metal fill material.

* * * * *